(12) United States Patent
Kuchimachi

(10) Patent No.: US 7,956,277 B2
(45) Date of Patent: Jun. 7, 2011

(54) THERMOELECTRIC MODULE

(75) Inventor: Kazuhiro Kuchimachi, Kirishima (JP)

(73) Assignee: Kyocera Corporation, Kyoto (JP)

( * ) Notice: Subject to any disclaimer, the term of this patent is extended or adjusted under 35 U.S.C. 154(b) by 1136 days.

(21) Appl. No.: 11/679,756

(22) Filed: Feb. 27, 2007

(65) Prior Publication Data

US 2007/0227158 A1    Oct. 4, 2007

(30) Foreign Application Priority Data

Mar. 31, 2006  (JP) .............................. P 2006-097500
Jan. 31, 2007  (JP) .............................. P 2007-021611

(51) Int. Cl.
*F25B 21/02*    (2006.01)
(52) U.S. Cl. .............................. 136/200; 62/3.3; 62/3.7
(58) Field of Classification Search .................. 136/200; 62/3.3, 3.7
See application file for complete search history.

(56) References Cited

U.S. PATENT DOCUMENTS

| 5,232,516 | A | * | 8/1993 | Hed ............................. 136/204 |
| 5,409,547 | A | * | 4/1995 | Watanabe et al. ............. 136/204 |
| 5,594,609 | A | | 1/1997 | Lin |
| 5,875,098 | A | * | 2/1999 | Leavitt et al. ................. 361/708 |
| 6,084,172 | A | * | 7/2000 | Kishi et al. .................... 136/200 |
| 6,264,207 | B1 | * | 7/2001 | Krestel ......................... 277/645 |
| 2002/0069908 | A1 | * | 6/2002 | Nomura ........................ 136/205 |
| 2004/0113549 | A1 | * | 6/2004 | Roberts et al. ................ 313/512 |

FOREIGN PATENT DOCUMENTS

| JP | 08-037323 | 2/1996 |
| JP | 2003-078088 | 3/2003 |
| JP | 2003078088 A | 3/2003 |
| JP | 2003-303183 | 10/2005 |

* cited by examiner

*Primary Examiner* — Jennifer K. Michener
*Assistant Examiner* — Matthew T Martin
(74) *Attorney, Agent, or Firm* — DLA Piper LLP (US)

(57) ABSTRACT

A thermoelectric module having an excellent durability is provide.

The thermoelectric module comprises: a first support substrate having a first inner surface, a first outer surface and a plurality of first connecting electrodes formed on the first inner surface; a second support substrate having a second inner surface opposed to the first inner surface, a second outer surface and a plurality of second connecting electrodes formed on the second inner surface; a plurality of P-type thermoelectric elements and a plurality of N-type thermoelectric elements provided between the first inner surface and the second inner surface; a temperature-detecting element provided on the first inner surface.

25 Claims, 14 Drawing Sheets ically, as shown in FIG. 10, an electronic com-
THERMOELECTRIC MODULE

BACKGROUND OF THE INVENTION

1. Field of the Invention

The present invention relates to a thermoelectric module used suitably for cooling a heating element and so forth in an air-conditioner, cooler, semiconductor, and so forth.

2. Description of the Related Art

Conventionally, a thermoelectric element in which Peltier effect is utilized has been used as a thermoelectric element for cooling because by passing an electric current therethrough, one end generates heat and the other end absorbs heat. In particular, the thermoelectric element has been expected to be utilized as a thermoelectric module, in a broad range of, temperature control in a laser diode, temperature adjustment in the following, and so forth. The temperature adjustment is in for example, a cooling device that is compact and has a simple structure and is chlorofluorocarbon-free, a refrigerator, a constant-temperature tank, a light-detecting element, an electronic cooling element in a semiconductor-producing apparatus or the like, and a laser diode.

For example, for using an electronic component such as a laser diode so that its temperature is adjusted, the temperature adjustment is performed by detecting the temperature near the laser diode and then feedbacking the temperature to a power source for the thermoelectric module (see, for example, Japanese Unexamined Patent Publication (Kokai) No. 2003-78088). Moreover, in a refrigerator or a constant-temperature tank, the temperature adjustment is performed by, detecting the inside temperature by using a temperature-detecting element such as a thermocouple, and then feedbacking the temperature to a power source for the thermoelectric module. Specifically, as shown in FIG. 10, an electronic component such as a laser diode serving as an object to be treated is disposed on a thermoelectric module for cooling or temperature-controlling the electronic component, and the thermoelectric module is disposed on a heat exchanger for discharging heat generated by the thermoelectric module. Then, in order to control or cool the temperature so that temperature rising of the objected to be treated is suppressed and so that the temperature becomes constant, the side of the object to be treated is cooled by passing electric current through the thermoelectric module. In this time, heat generated from the thermoelectric module is discharged by flowing a fluid such as water or air through the heat exchanger. In such a thermoelectric module, when the temperature in the side thereof for the object to be treated becomes too cool, the electric current being passed through the thermoelectric module is suppressed or electric current is inversely passed through the thermoelectric module to generate heat, and thereby the temperature adjustment has been performed.

However, in a conventional apparatus, because the temperature-detecting element measures the temperature of the object to be treated and there is a distance between the thermoelectric element and the object to be treated, a time lag has been generated until the temperature transmits from the heat-absorbing or heat-generating part to the temperature-detecting element. Furthermore, the object to be treated in a refrigerator and so forth is an air, and therefore, the time lag has been larger because an air has a slow transmission of temperature. Therefore, when the water or the air flowing through the heat exchanger attached to the thermoelectric module makes a halt, the temperature in the entirety of the module comes to rapidly rise and, occasionally, the thermoelectric element is oxidized or solder that is bonding the thermoelectric element and a support substrate comes to melt.

SUMMARY OF THE INVENTION

Accordingly, an object of the present invention is to provide a thermoelectric module having an excellent durability.

To achieve the above object, a first thermoelectric module according to the present invention comprising:

a first support substrate having a first inner surface, a first outer surface and a plurality of first connecting electrodes formed on the first inner surface;

a second support substrate having a second inner surface opposed to the first inner surface, a second outer surface and a plurality of second connecting electrodes formed on the second inner surface;

a plurality of P-type thermoelectric elements and a plurality of N-type thermoelectric elements, which are provided alternately between the first inner surface and the second inner surface;

a temperature-detecting element provided on the first inner surface;

wherein each of the first connecting electrodes and the second connecting electrodes connects one of the P-type thermoelectric elements with neighboring one of the N-type thermoelectric elements to form a series connection.

According to the first thermoelectric module according to the present invention, because a temperature-detecting element is attached to an inner surface of the first support substrate, temperature abnormality in a thermoelectric-element part can be immediately detected.

Moreover, in the present invention, because the first and second support substrates are disposed so as to be opposed to each other as support substrates, it becomes possible to attach a temperature-detecting element to any one of the upper and lower support substrates, and its general versatility will expand. Furthermore, because it becomes easy to attach a heat exchanger and an object to be treated, it becomes possible to improve reliability of its performance.

A second thermoelectric module according to the present invention comprising:

a first support substrate having a first inner surface, a first outer surface and a plurality of first connecting electrodes formed on the first inner surface;

a second support substrate having a second inner surface opposed to the first inner surface, a second outer surface and a plurality of second connecting electrodes formed on the second inner surface;

a plurality of P-type thermoelectric elements and a plurality of N-type thermoelectric elements, which are provided alternately between the first inner surface and the second inner surface;

a sealing member forming a sealed space between the first inner surface and the second inner surface, the sealed space including at least part of the plurality of P-type thermoelectric elements and the plurality of N-type thermoelectric elements;

wherein each of the first connecting electrodes and the second connecting electrodes connects one of the P-type thermoelectric elements with neighboring one of the N-type thermoelectric elements to form a series connection.

In the second thermoelectric module constituted aforementioned above according to the present inventions dew condensation in the thermoelectric modules and electrode parts connecting them can be reduced to be maintain good condition.

DETAILED DESCRIPTION OF THE INVENTION

Figure 1:
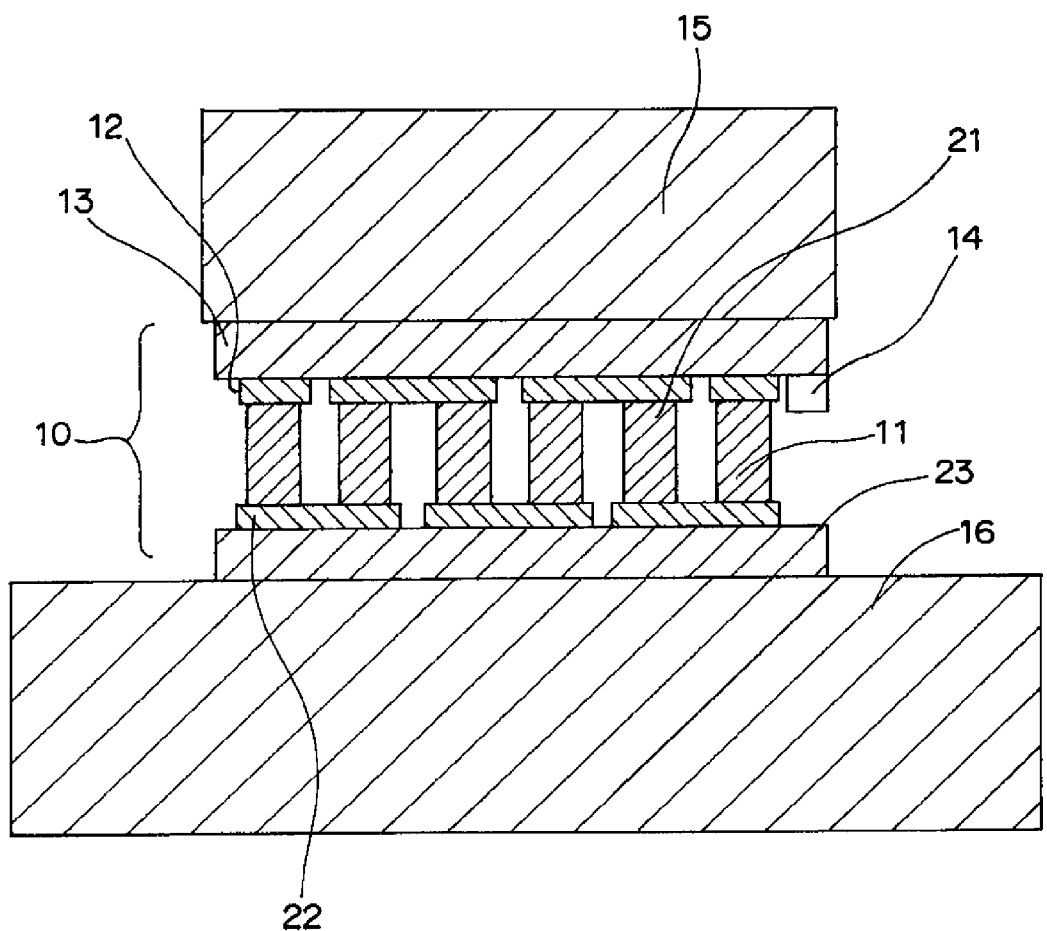
FIG. 1 is a section view showing a schematic structure of a first thermoelectric module according to the present invention.

The thermoelectric module of the present invention comprises a plurality of thermoelectric elements and a support substrate having electrodes that are electrically connected with the thermoelectric elements, and the plurality of thermoelectric elements and a temperature-detecting element are attached to the support substrate. That is, as shown in FIG. 1, in the thermoelectric module of the present invention, the N-type thermoelectric elements 11 and the P-type thermoelectric elements 21 are alternatively arrayed between the first support substrate 13 and the second support substrate 23, and the N-type thermoelectric elements 11 and the P-type thermoelectric elements 21 that are contiguous are connected by a first connecting electrode 12 formed on an inner surface of the first support substrate 13 and by a second connecting electrode 22 formed on an inner surface of the second support substrate 23. And, in the present invention, in particular, as shown in FIG. 1, it is characterized that a temperature-detecting element 14 is provided on an inner surface of the first support substrate 13, and thereby abnormal temperature change near the N-type thermoelectric elements 11 or the P-type thermoelectric elements 21 in the thermoelectric module can be immediately detected.

In addition, FIG. 1 is a section view showing a basic structure of the present invention. The symbol 15 represents an object to be treated. The symbol 16 represents a heat exchanger. Moreover, the symbol 10 represents a heat-absorbing and heat-generating part composed of two of the first and second support substrates and the N-type thermoelectric elements 11 and the P-type thermoelectric elements 21.

Hereinafter, a thermoelectric module of an embodiment according to the present invention will be explained with reference to the accompanying drawings. In addition, in the present specification, when the N-type thermoelectric elements 11 and the P-type thermoelectric elements 21 are undistinguished and referred to, they are simply referred to as the thermoelectric element(s). Moreover, when the first support substrate 13 and the second support substrate 23 are not particularly distinguished and referred to, they are simply referred to as the support substrates).

Embodiment 1

Figure 2A:
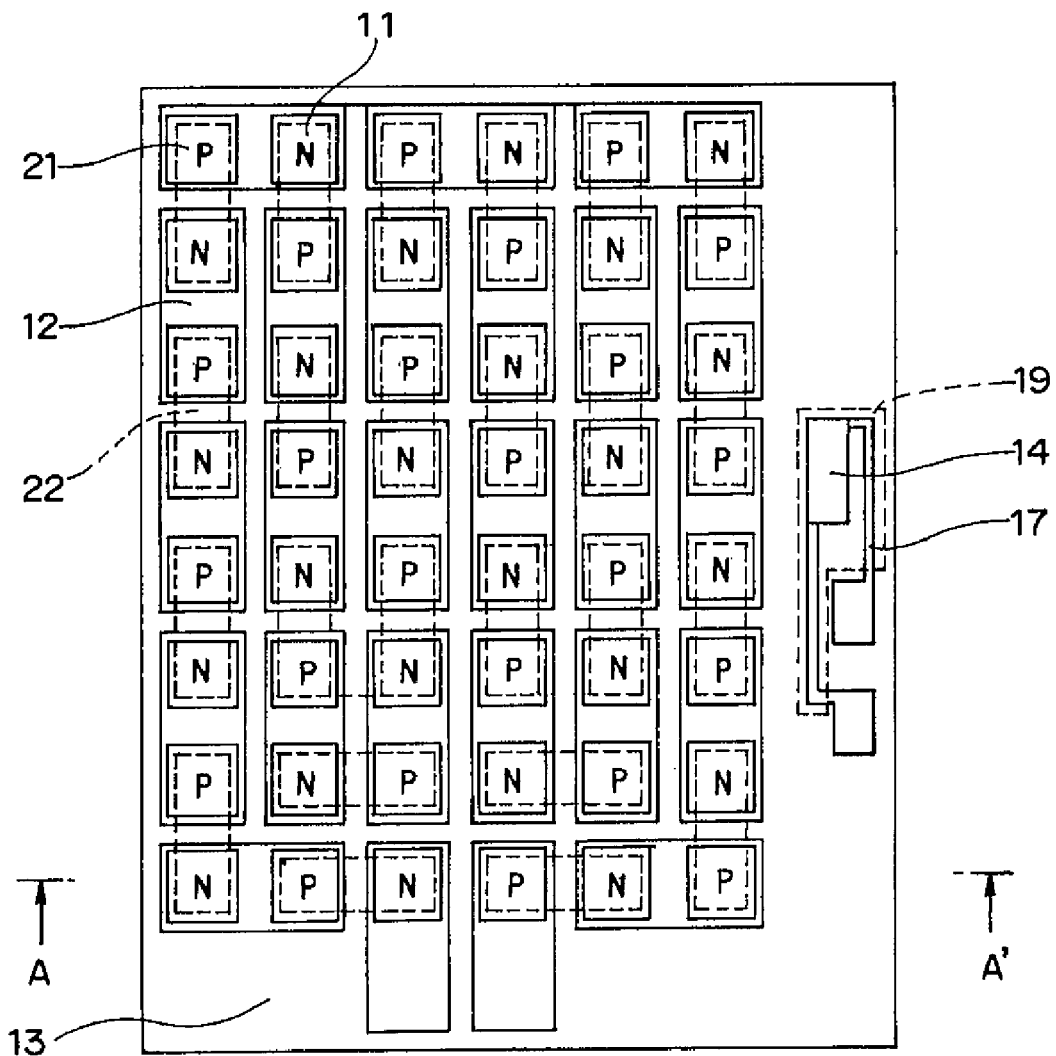
FIG. 2A is a perspective view of a thermoelectric module of an embodiment 1 according to the present invention that is viewed from a first support substrate, where the solid lines represent structural components formed on the thermoelectric element and on the first support substrate, and the dash lines represent structural components formed on the first support substrate.

In the thermoelectric module of an embodiment 1 according to the present invention, the plurality of N-type thermoelectric elements 11 and the plurality of P-type thermoelectric elements 21 are arrayed in a predetermined arrangement so that the N-type thermoelectric element 11 and the P-type thermoelectric element 21 are contiguous to each other, between the first support substrate 13 and the second support substrate 23 that provided so as to be opposed to each other. And, as shown in FIG. 2A and so forth, the N-type thermoelectric element 11 is connected with the P-type thermoelectric element 21 contiguous thereto by a first second 12 formed on an inner surface of the first support substrate 13, and the P-type thermoelectric element 21 is connected with the N-type thermoelectric element 11 contiguous thereto by a second connecting electrode 22 formed on an inner surface of a second support substrate 23. In this way, in the thermoelectric module of the embodiment 1, a serious circuit in which the N-type thermoelectric elements 11 and the P-type thermoelectric elements 21 are alternatively connected (N-type thermoelectric element 11—second connecting electrode 22—P-type thermoelectric element 21—first connecting electrode 12—N-type thermoelectric element 11—second connecting electrode 22—P-type thermoelectric element 21—first connecting electrode . . . ) is comprised between the first support substrate 13 and the second support substrate 23. Here, the thermoelectric elements and the connecting electrodes are bonded with, for example, solder.

When electric current is passed through the series circuit comprised as described above, one of the first connecting electrode 12 and the second connecting electrode 22 becomes in a cooling side by the electric current flowing from the N-type thermoelectric element 11 to the P-type thermoelectric element 21, and the other becomes in a heat-generating side by the electric current flowing from the P-type thermoelectric element 21 to the N-type thermoelectric element 11.

Figure 2B:
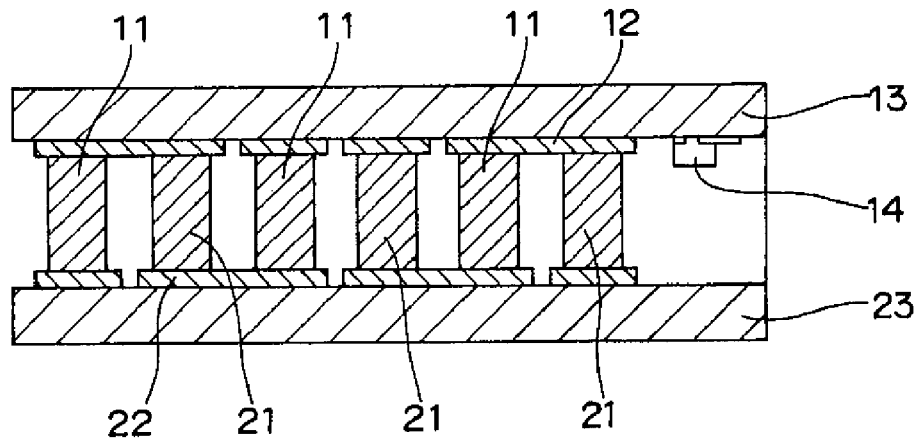
FIG. 2B is a section view taken along lines A-A' in FIG. 2A.

And in the thermoelectric module of the embodiment 1, as shown in FIGS. 2A and 2B, on an inner surface of the first support substrate 13, a wiring pattern 17 is formed and a temperature-detecting element 14 is provided, so as to be close to the connecting electrode 12. Thereby, temperature change in an inner surface of the first support substrate 13 is rapidly transmitted to the temperature-detecting element 14, and as soon as an abnormal heat-absorbing or heat-generating phenomenon in an inner surface of the first support substrate 13 is caused, the phenomenon is detected by the temperature-detecting element 14.

In addition, in the thermoelectric module of the embodiment 1, the temperature-detecting element 14 and the wiring pattern 17 is coated with a coating material 19. Hereinafter, each component in the embodiment 1 will be explained in detail.

<Thermoelectric Element>

In the embodiment 1, as described above, the P-type thermoelectric elements and the N-type thermoelectric elements are alternatively arrayed between the first support substrate and the second support substrate. It is preferable that the thermoelectric elements are regularly arrayed lengthwise and crosswise on the support substrates. For example, as shown in FIG. 2A that is a plan view seen through from the above surface of the first support substrate 13, and so forth, lengthwise lines and horizontal lines in which the P-type thermoelectric elements and the N-type thermoelectric elements are alternatively arrayed are respectively comprised in a grid.

<Support Substrate>

As shown in FIG. 1, it is preferable that the support substrate is composed of a pair of the first support substrate 13 and the second support substrate 23 that are disposed so as to be opposed to each other. However, it may be composed of one support substrate. In this case, on the surface of the one support substrate on which the connecting electrodes are formed, the temperature-detecting element is disposed. In the case of using one support substrate, the thermoelectric elements in the opposite side to the support substrate are connected by using copper chips or the like.

As the support substrate, if the one pair of the support substrates that are disposed so as to be opposed to each other is used, the temperature-detecting elements can be provided on both of the support substrates. Thereby, abnormal temperature change in both of the heat-absorbing side and the heat-generating side can be detected. Moreover, when one pair of support substrates is used, solder or grease for fixing the object to be treated or fixing the heat exchanger can be suppressed from dripping.

In the case of using one pair of support substrates, when electric current is supplied, the temperature of one of them becomes low and that of the other becomes high as described above.

By attaching the temperature-detecting element to the support substrate of which temperature becomes low when electric current is supplied, the temperature near the thermoelectric elements can be controlled. Therefore, overshooting of the temperature of the object to be treated can be suppressed, and durability of the object to be treated can be improved and the load on the thermoelectric module can be reduced. Therefore, durability of the thermoelectric module can be improved.

Moreover, by contrast, by attaching the temperature-detecting element to the support substrate of which temperature becomes high when electric current is supplied, the temperature-detecting element, a conductive wire from the element, and its surrounding atmosphere, become dried and difficult to be subjected to dew condensation, and therefore become difficult to be short-circuited. Durability of the wire part can be improved. Thereby, it becomes possible to improve reliability of temperature detection of the thermoelectric module. Moreover, in the case in which the thermoelectric module has a heat exchanger, when water or air in the heat turns off and the thermoelectric module comes to generate heat, it can be immediately detected that the heat exchanger turns off. Thereby, durability of the thermoelectric module can also be enhanced.

On the surfaces of the pair of the support surfaces, a position to which the temperature-detecting element is attached may be on a back surface of the support substrate. In this case, the contact when the heat exchanger or the object to be treated is provided becomes small, degradation of performance of the temperature-detecting element 14 is caused. Accordingly, in the present invention, it is preferable that the temperature-detecting element is attached to at least one of the inner surfaces opposed to each other. Thereby, yield of assembly can also be improved. In addition, the inner surface represents the surface of the support substrates on which the thermoelectric elements are arrayed, and the back surface represents the surface of the support substrates on which the thermoelectric elements are not arrayed.

When a metal that can get wet with solder such as copper is disposed, it becomes possible to solder the heat exchanger 16 or the object to be treated 15 with the support substrate. As the support substrate, for example, it is possible to use ceramics such as alumina or aluminum nitride, resin substrate such as epoxy or polyimide, or substrate in which heat transference is improved by mixing filler of ceramics in resin of epoxy or polyimide.

Figure 2C:
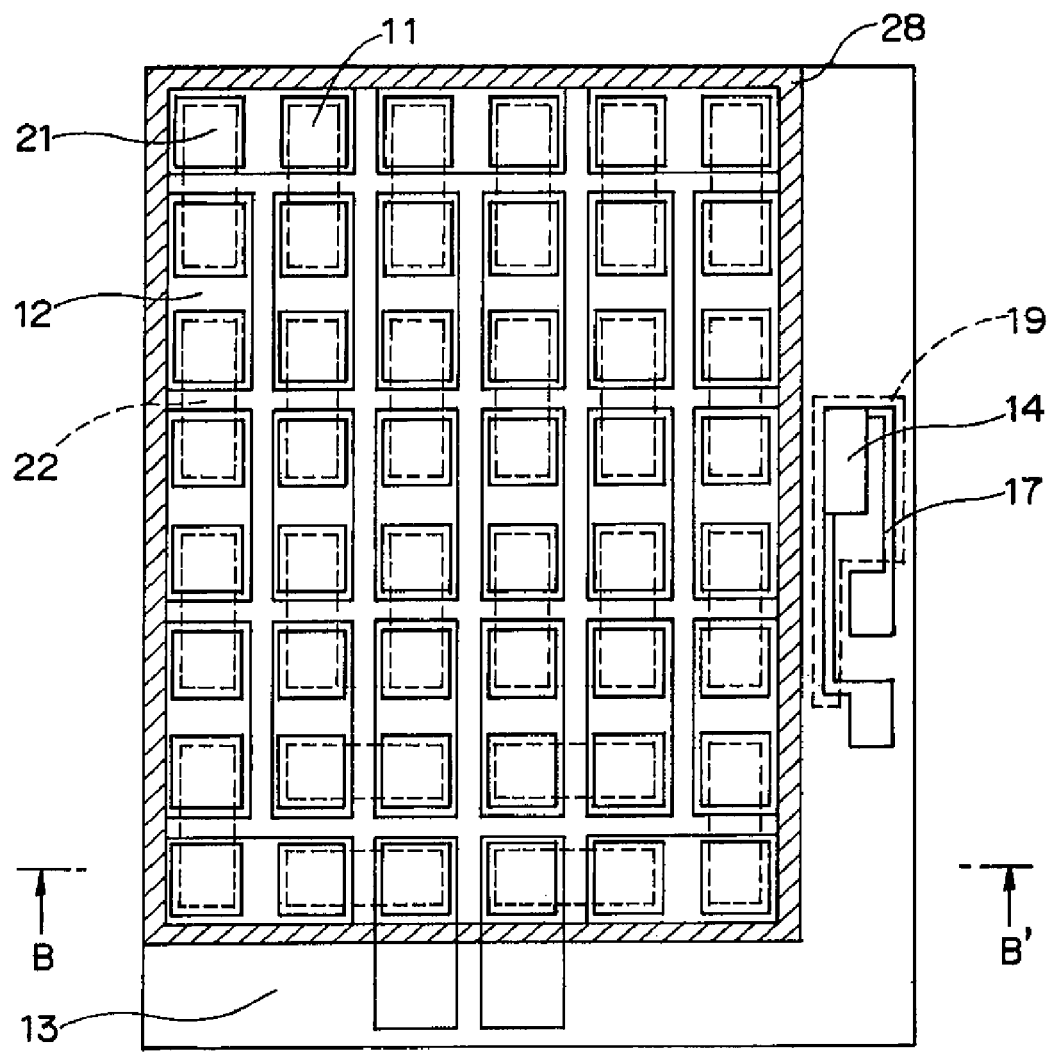
FIG. 2C is a perspective view of a thermoelectric module of a first modified example according to the embodiment 1 that is viewed from the above of the first support substrate.
Figure 2D:
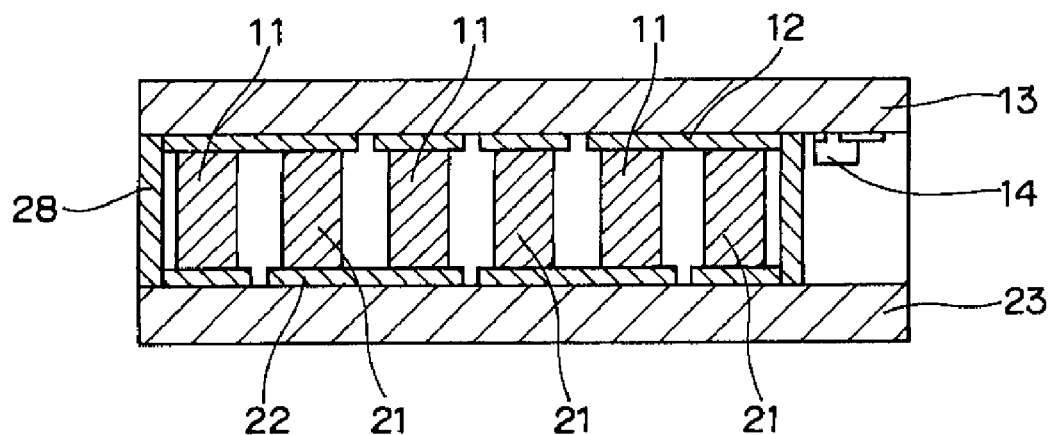
FIG. 2D is a section view (1) taken along lines B-B' in FIG. 2C.

As shown in FIGS. 2C and 2D, it is preferable that the peripheral border of the support substrate is blocked with a sealing member 28. Thereby, a circuit of the thermoelectric module can be suppressed from dew condensation. The part on which the sealing member 28 is provided is not limited to the peripheral border and may be an outer circumference of the substrate.

It is preferable that as the sealing member 28, an adhesive agent having a low hardness is used. For example, a silicone adhesive agent having a soft hardness and elasticity is more preferable. When an adhesive agent having a low hardness is used as the sealing member 28, thermal stress generated between the support substrate in the high-temperature side and the support substrate in the low-temperature side can be relaxed.

A method for applying the sealing member 28 includes, for example, a method for sealing a side surface by applying an appropriate amount of an adhesive agent by using a dispenser or the like.

It is preferable that as the sealing member 28, at least two or more kinds of sealing materials having different hardnesses are used. It is preferable that such a sealing member made of at least two or more kinds of sealing materials having different hardnesses is made of a sealing material having a low hardness and a sealing material having a high hardness. Here, the sealing material having a low hardness includes a material containing a silicon-based material as a main component. The sealing material having a high hardness includes a material containing an epoxy-based material as a main component.

It is preferable that a position to which the sealing member is attached is a peripheral border considering workability in attaching a lead wire for supplying a power to thermoelectric module. If an end face of the upper and lower substrates is crashed in assembling, a Peltier element in a peripheral part becomes in danger of being damaged. Therefore, when the sealing member is attached to the peripheral part, strength of the substrates can be enhanced.

Moreover, the provision in the periphery when a Peltier module is provided with a lead wire for supplying a power is easier to produce the thermoelectric module. In providing the sealing member in the periphery, a stress is generated in the Peltier element by a contact of a soldering gun or by heat from a soldering gun. Therefore, the strength is enhanced by attaching the sealing member.

Moreover, because one surface is cooled and the other surface is heated in a Peltier module, a thermal stress is generated so that the substrate is curved by difference in thermal expansion. The force due to the thermal stress is the maximum in the periphery. However, when the sealing member having a high hardness is provided perpendicularly to the support substrates and thereby the first support and second support substrates are connected in the peripheral part, the module tries to be deformed in a state that the peripheral part is fixed, and therefore the maximum stress place is transferred to a central part of the substrate on which a number of the elements exist and of which strength is high, and the force due to the thermal stress can be dispersed.

It is preferable that between the support substrates of which peripheral border is blocked with the sealing member 28, a dry gas is sealed. Thereby, even when the module is used at a low temperature, it becomes possible to suppress dew condensation and therefore reliability of temperature detection can be improved.

Moreover, it is preferable that the interval of the support substrates of which peripheral border is blocked with the sealing member 28 is depressurized. Thereby, temperature convection of the upper and lower substrates can be insulated by vacuum heat insulation, and cooling-performance improvement and long-term reliability in the thermoelectric module can be ensured.

Figure 2E:
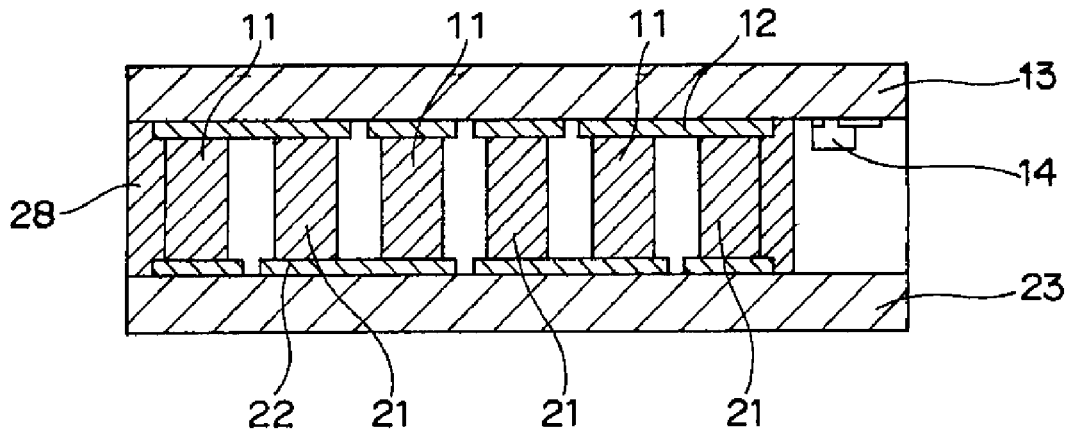
FIG. 2E is a section view (2) taken along lines B-B' in FIG. 2C.

The sealing member 28 in the peripheral border may be formed so as to be separate from the thermoelectric elements as shown in FIG. 2D, or may be formed so as to be in contact with the thermoelectric elements as shown in FIG. 2E.

When the sealing member 28 is formed so as to be separate from the thermoelectric elements, ebb of heat from the Peltier elements to the sealing member can be suppressed. Therefore, cooling-performance degradation and accuracy degradation can be suppressed.

Moreover, when the sealing member is formed so as to be in contact with the thermoelectric elements, strength of the sealing part can be improved, and therefore damage of the sealing part due to pressure difference between the inside and the outside of the sealing can be suppressed.

<Temperature-Detecting Element>

The temperature-detecting element includes a thermocouple, a resistor bulb, a thermistor, a thermoswitch, or the like. Among them, the thermistor is easy to be handled because the thermistor is an element of which electrical resistivity is changed by its temperature and which does not have a wire and so forth. Furthermore, because the thermistor is a small size and a thermal capacity thereof can be small, the thermistor is used even in a thermoelectric module having a small amount of absorbed heat, heat-absorbing or heat-generating performance is not affected. Accordingly, the thermistor is most preferable as the temperature-detecting element.

In the drawings, with respect to the temperature-detecting element, only one is depicted. However, it is preferable that a plurality of the temperature-detecting elements are attached to, particularly, an inner side of the support substrate. Thereby, it becomes possible to measure an average temperature. Moreover, it is preferable that the plurality of the temperature-detecting elements are attached to the same support substrate. Thereby, it becomes possible that even if one of the temperature-detecting elements is broken down, the temperature detection is normally performed by another temperature-detecting element.

Figure 3:
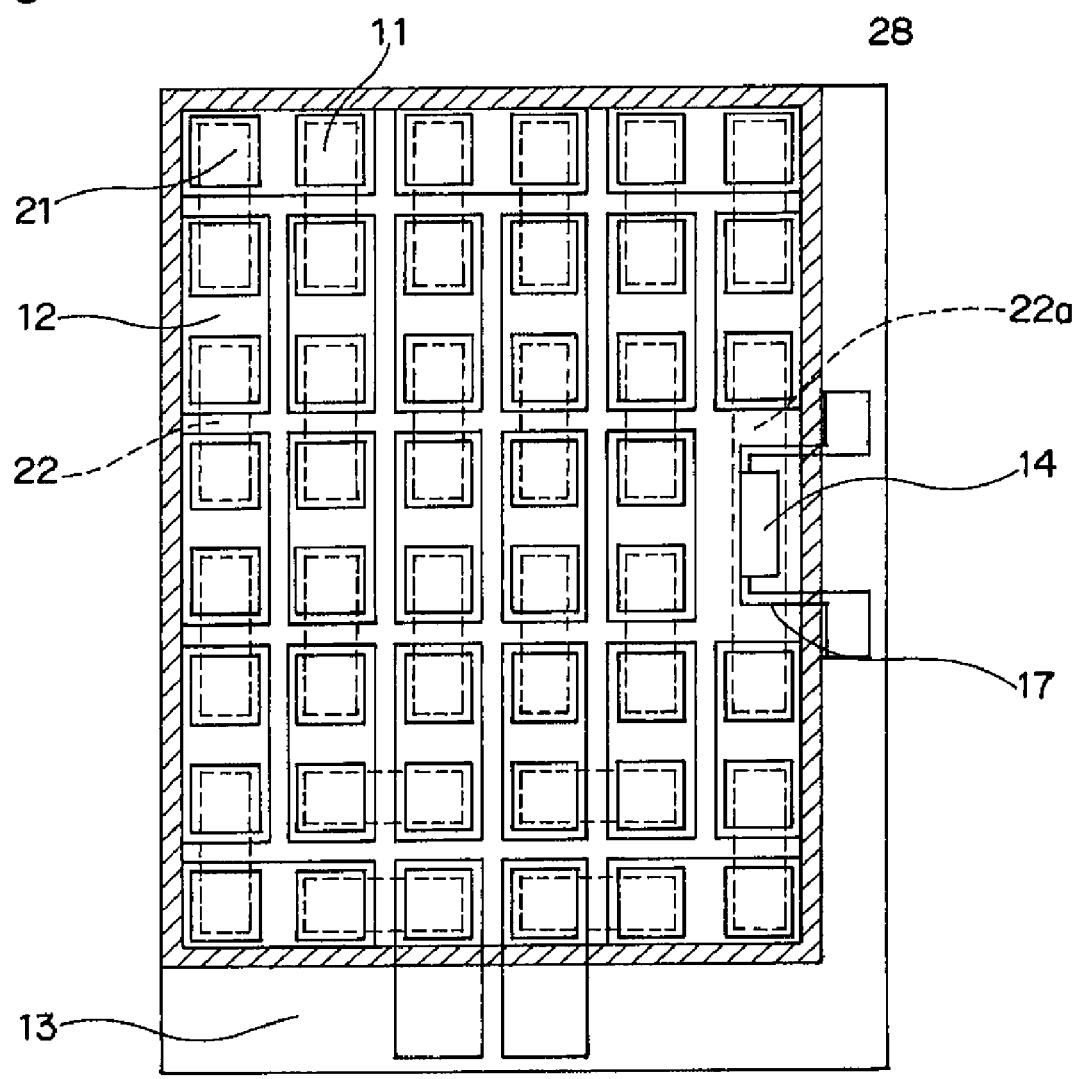
FIG. 3 is a perspective view of a thermoelectric module of a second modified example according to the embodiment 1 that is viewed from the above of the first support substrate.

It is preferable that when the plurality of thermoelectric elements are regularly arrayed lengthwise and crosswise on the support substrates, the temperature-detecting element 14 is disposed so as to be contiguous to at least two thermoelectric elements as shown in FIG. 3. When the temperature-detecting element is disposed as described above, the temperature can be detected at the position nearer to the thermoelectric elements, and abnormal temperature change can be more immediately detected. Moreover, the temperature-detecting element becomes difficult to be subjected to affection of an atmosphere such as flowing of a wind. Therefore, it becomes possible to enable constantly accurate measurement of the temperature. Here, "the temperature-detecting element is disposed so as to be contiguous to at least two thermoelectric elements" means that the temperature-detecting element is disposed so as to be sandwiched between the thermoelectric elements or means that the temperature-detecting element is disposed at a corner of a regular array of the plurality of thermoelectric elements in the lengthwise and crosswise directions.

Figure 4:
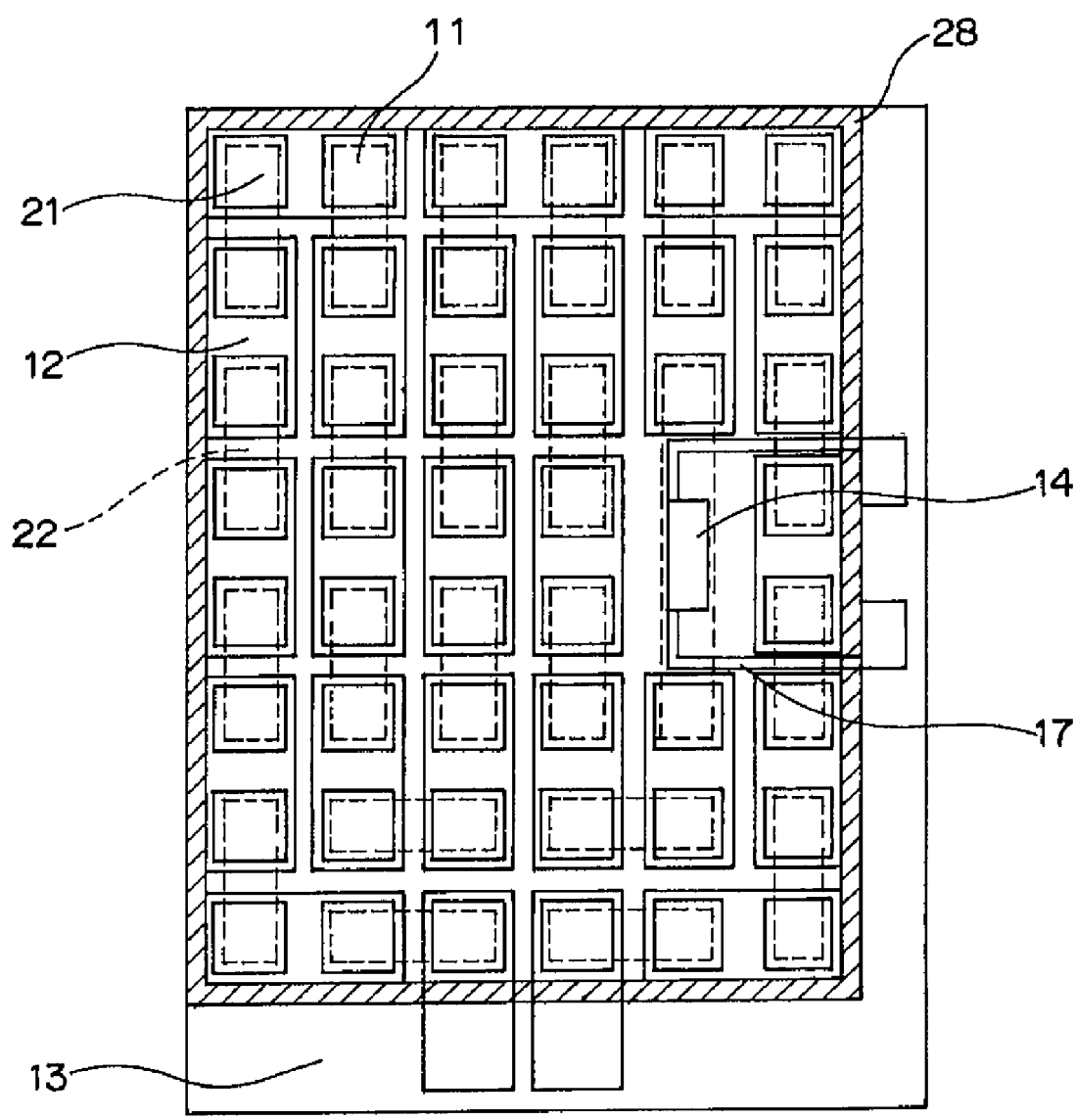
FIG. 4 is a perspective view of a thermoelectric module of a third modified example according to the embodiment 1 that is viewed from the above of the first support substrate.

Moreover, when the plurality of thermoelectric elements are regularly arrayed lengthwise and crosswise on the support substrates, it is more preferable that the temperature-detecting element is disposed at a position surrounded in at least three sides thereof by the thermoelectric elements as shown in FIG. 3. Even more preferably, as shown in FIG. 4, the temperature-detecting element is disposed at a position surrounded in four sides thereof by the thermoelectric elements. When the temperature-detecting element is disposed at a position surrounded by the thermoelectric elements as described above, affection by the atmosphere can be further smaller and more accurate measurement of the temperature becomes possible.

In a specific example as shown in FIG. 31 in the first connecting electrodes 21 that is formed regularly (in a matrix form) so as to correspond to an array of the thermoelectric elements, one of the connecting electrodes 21 that is located in an outermost side thereof is not formed, and at its position, the temperature-detecting element 14 is provided. In this case, the N-type thermoelectric element 11 and the P-type thermoelectric element 21 that are located in both sides of the temperature-detecting element 14 are connected by a connecting electrode 22a formed on the second support substrate.

In a specific example as shown in FIG. 4, in the first connecting electrodes 21 that is formed regularly (in a matrix form) so as to correspond to an array of the thermoelectric elements, one of the first connecting electrodes 21 that exists in an inner side except the outermost sides thereof is not formed, and at its position, the temperature-detecting element 14 is provided. In this case, the N-type thermoelectric element 11 and the P-type thermoelectric element 21 that are located in both sides of the temperature-detecting element 14 are connected by a connecting electrode 22b formed on the second support substrate.

Here, in FIGS. 3 and 4, it is exemplified that in the structures in which the sealing member 28 is formed, the temperature-detecting element 14 is disposed at a position surrounded in three or four sides thereof by the thermoelectric elements. However, the present invention is not limited thereto. In the structure that does not have the sealing member 28, when the temperature-detecting element 14 is disposed at a position surrounded in three or four sides thereof by the thermoelectric elements, the same effect can be obtained. In addition, in the structure in which the sealing member 28 is formed, when the temperature-detecting element 14 is disposed at a position surrounded by the thermoelectric elements in three or four sides thereof and inside the sealing member 28, the temperature-detecting element 14 can be protected without coating the temperature-detecting element 14 with a coating material as shown in FIGS. 3 and 4.

As described above, as shown in FIGS. 3 and 4, when the temperature-detecting element is disposed at a position surrounded by the thermoelectric elements and furthermore the peripheral border of the support substrates is blocked with a sealing member, the electrodes and the thermoelectric elements in the thermoelectric module can be suppressed from dew condensation and leakage of electric current in the thermoelectric module can be lowered. Therefore, reliability of temperature detection can be improved.

<Wiring Pattern>

A wiring pattern 17 is connected to the temperature-detecting element as shown in FIGS. 2-4.

It is preferable that the wiring patter 17 is formed on a surface of the support substrate. In an etching process in which the electrodes for the thermoelectric elements are formed on a surface of the support substrate, by forming the wiring pattern at the same time, the processes can be simplified and it becomes possible to very easily perform attachment of the temperature-detecting element.

For example, in FIG. 2, the temperature-detecting element 14 is connected by solder or a conductive adhesive agent to a part for disposing a temperature-detecting element thereon on the wiring pattern 17 formed on an inner surface of the first support substrate 13. On ends of the temperature-detecting element 14, electric-power-supplying parts exist, and a lead wire is bonded to the electric-power-supplying part. When the positions of the lead wire and the temperature-detecting element 14 are set to be separate from each other, ebb of heat through the lead wire becomes small and variability of the measured temperature can be smaller.

As shown in FIGS. 2A and 2B, it is preferable that the temperature-detecting element 14 and the wiring pattern 17 that exist outside the sealing member 28 are coated with a coating material 19 having an insulating property and a wet resistance. The coating material having an insulating property and a wet resistance includes epoxy resin, silicone resin, acryl resin, and so forth. As shown in FIG. 2A, "the coating with a material having an insulating property and a wet resistance" means that a place of the wiring pattern that is exposed from the support substrate is coated.

Moreover, when the temperature-detecting element is a thermistor, a thermoswitch, or the like, it is necessary to electrically connect the wiring pattern and the temperature-detecting element that are disposed on the support substrate. In the electrically connected parts, solder or a conductive adhesive agent can be used. The connected part is coated at the same time as coating the wiring pattern and the temperature-detecting element with the coating material 19. For example, in the case of FIG. 1, the electrically connected parts exist in the interface between the temperature-detecting element 14 and the support substrate 13.

When the wiring pattern is coated with a coating material, the temperature-detecting element 14 and the wiring pattern can be prevented from being short-circuited due to dew condensation, and correct resistance of the temperature-detecting element 14 can be detected. Therefore, the temperature can be accurately detected. The reason why the temperature cannot be correctly measured due to dew condensation is that when water due to dew condensation adheres to the temperature-detecting element 14 and the wiring pattern, the resistance in the thermistor or the like becomes impossible to be correctly measured.

A method for coating the wiring pattern with a coating material includes a method comprising, connecting the temperature-detecting element 14, then applying resin having an adhesive property by a dispenser or the like, and thereby curing the resin.

It is preferable that the coating is performed on the temperature-detecting element as well as on the wiring pattern.

In the thermoelectric module of the present invention, it is preferable that as well as the thermoelectric elements and the support substrates and the temperature-detecting element and the wiring pattern, a heat exchanger by which a fluid is flown in a predetermined direction and thereby heat exchange is performed is attached to at least one outer surface of the one pair of the support substrates.

FIG. 1 shows an example in which the heat exchanger 16 is provided on an outer surface of the second support substrate 23 in the heat-absorbing or heat-generating part 10. Moreover, in the present invention, it is preferable that the temperature-detecting element 14 is provided in the outlet side for the fluid.

<Heat Exchanger>

In a preferable example of the present invention, a heat exchanger that has a channel through which a fluid to be a refrigerant flows and that heat exchange is performed by flowing the fluid in a predetermined direction by is attached to at least one outer surface side of the one pair of support substrates.

As described above, such a heat exchanger is provided on at least one of the pair of support substrates and functions for discharging heat with a refrigerant such as water or air by an amount of heat generated by the thermoelectric module and thereby holding the temperature of the one support substrate 13 of the thermoelectric module to be constant. As the heat exchanger, there are a heat exchanger in which a channel is provided in the metal having high conductivity of heat such as copper or aluminum and by which heat is discharged by flowing a refrigerant such as wafer through the channel, and a heat exchanger in which a metal having high conductivity of heat such as copper or aluminum that is accordion-folded or a complicated rib is provided and by which heat is released by blowing a gas such as air thereto.

When the heat exchanger is provided on one of the pair of support substrates, as shown in FIG. 1, an object to be treated 15 which is to be cooled or of which temperature is to be controlled is provided on the other support substrate.

Figure 5:
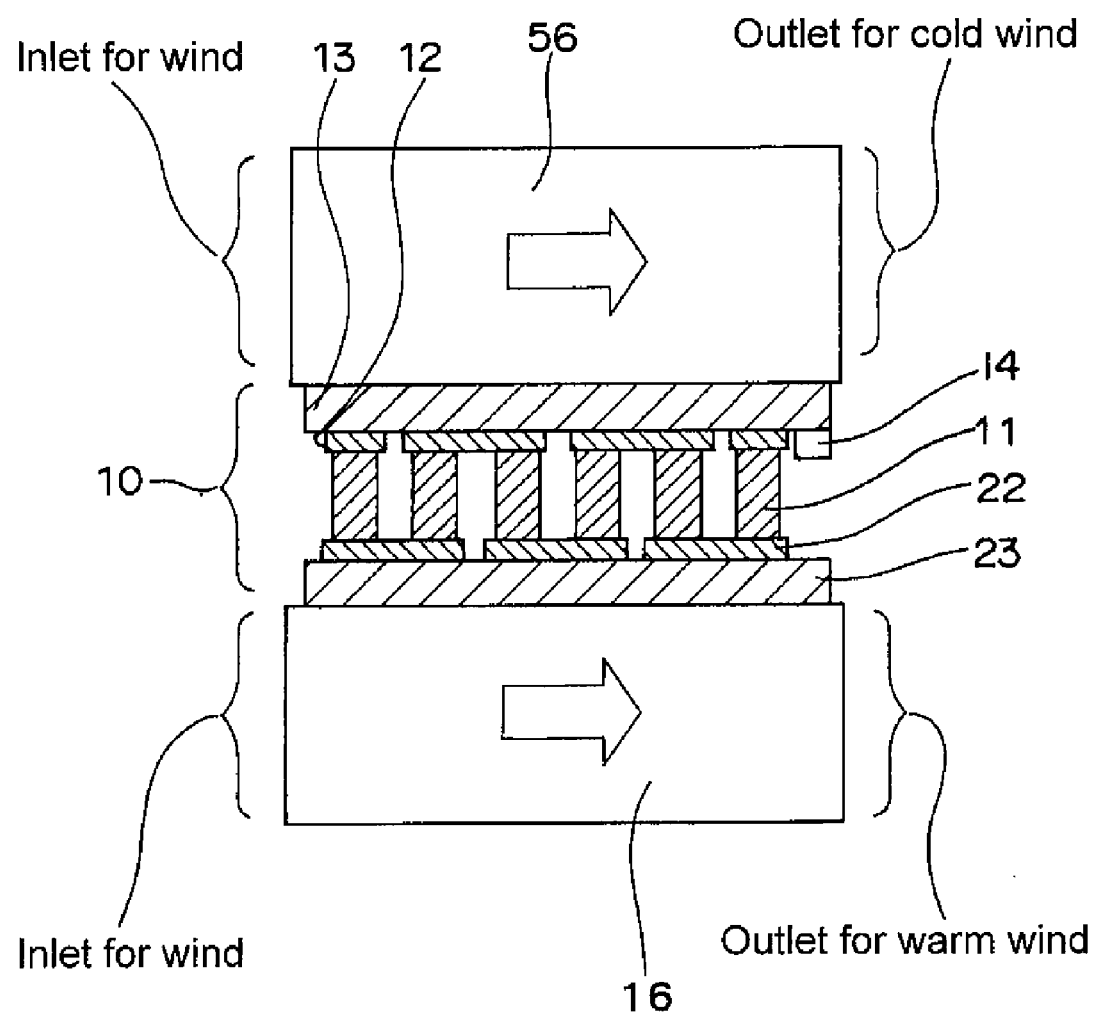
FIG. 5 is a section view showing a structure of a thermoelectric module of a fourth modified example according to the embodiment 1.

Moreover, as shown in FIG. 5, in the present invention, the heat exchangers can also be provided in both sides of the one pair of support substrates. Specifically, as the heat exchangers, for example, wave-shaped fins are attached to both sides of the thermoelectric module, and an air is flowed from a side surface and therewith the thermoelectric module is supplied with electric current, and thereby a cold wind is generated in one side surface and a warm wind is generated in the other side surface. In a system for utilizing the cold wind and performing cooldown, the temperature-detecting element 14 is attached to the outlet side for the fluid in the support substrate 23, and thereby, the temperature of the cold wind can be accurately measured. Therefore, temperature control of the wind becomes easy. Moreover, by the thermoelectric element, it becomes difficult to be affected by the outside environment. Therefore, without affected by the outside air temperature, the temperature based on only the cooled air can be detected.

As described above, in the thermoelectric module of the embodiment 1, the temperature-detecting element 14 is attached to the surface to which the thermoelectric elements are attached in at least one of the support substrates, and thereby it is made possible to immediately detect abnormal heat generation or abnormal heat absorption in thermoelectric elements and to handle the abnormality, and thereby its durability is improved. However, in the present invention, the durability may be improved in the manner to be described in the following embodiment.

Embodiment 2

Figure 6A:
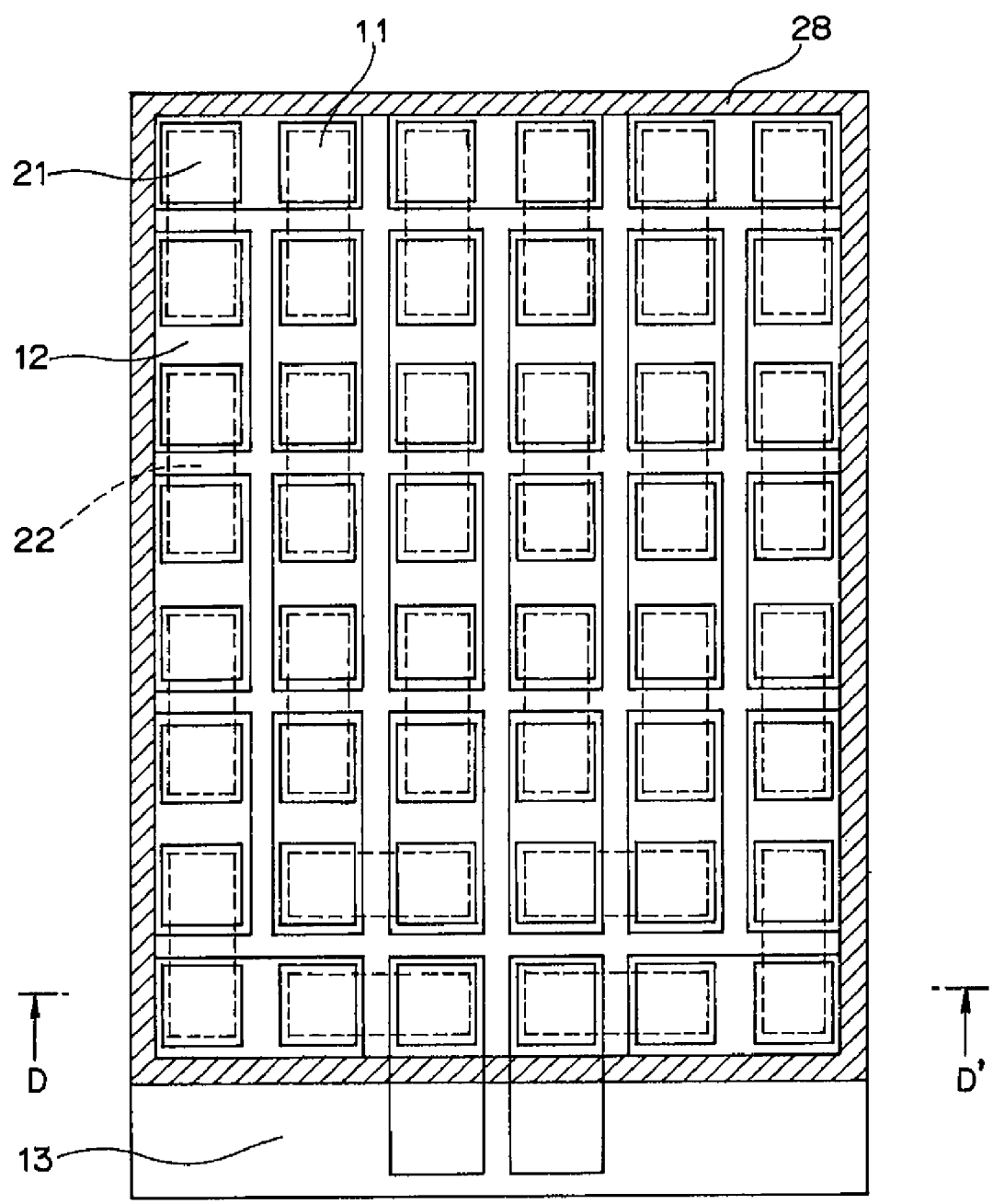
FIG. 6A is a perspective view of a thermoelectric module of an embodiment 2 according to the present invention that is viewed from the above of a first support substrate.

As shown in FIG. 6A, in the thermoelectric module of an embodiment 2 according to the present invention, without attaching the temperature-detecting element thereto, the durability is enhanced by blocking the periphery of the support substrates with the sealing member 28. That is, in the thermoelectric module as shown in FIG. 6A, by blocking the periphery of the support substrate with the sealing member 28, the circuit of the thermoelectric module can be suppressed from dew condensation, and thereby electric current leakage from the thermoelectric module can be suppressed. In addition, in the present invention, a part provided with the sealing member 28 is not limited to the peripheral border of the support substrates, and may be the outer circumference of the substrate, or may be formed so as to seal some of the thermoelectric elements as described in detail later.

It is preferable that as the sealing member 28, an adhesive agent having a low hardness is used, and for example, a silicone adhesive agent having a soft hardness and elasticity is more preferable. When such an adhesive agent of low hardness is used, a thermal stress generated between the support substrate in the high-temperature side and the support substrate in the low-temperature side can be relaxed.

A method for applying the sealing material includes a method for sealing a side surface by applying an appropriate amount of the adhesive agent by using a dispenser or the like.

It is preferable that as the sealing member 28, at least two or more kinds of sealing materials having different hardnesses are used. It is more preferable that the sealing member made of the two or more kinds thereof having different hardnesses is made of a sealing material of low hardness and a sealing material of high hardness. Here, the sealing material of low hardness includes a material containing a silicone-based material as a main component, and the sealing material of high hardness includes a material containing an epoxy-based material as a main component.

In addition, the hardness refers to a shore hardness and is calculated from the pushing depth of the push needle when a push needle having a predetermined shape having a predetermined shape is stuck by a spring force with a certain load by using a durometer hardness tester based on JIS K 6253.

In the embodiment 2, it is preferable that a dry gas is sealed in a sealed space between the support substrates of which peripheral border is blocked with the sealing member 28. Thereby, even when the thermoelectric module is used at a low temperature, it becomes possible to suppress dew condensation and therefore reliability of temperature detection can be improved.

Moreover, it is preferable that the sealed space between the support substrates that is blocked with the sealing member 28 is depressurized. Thereby, temperature convection of the upper and lower substrates can be blocked by vacuum heat insulation, and cooling-performance improvement and long-term reliability in the thermoelectric module can be ensured.

Figure 6B:
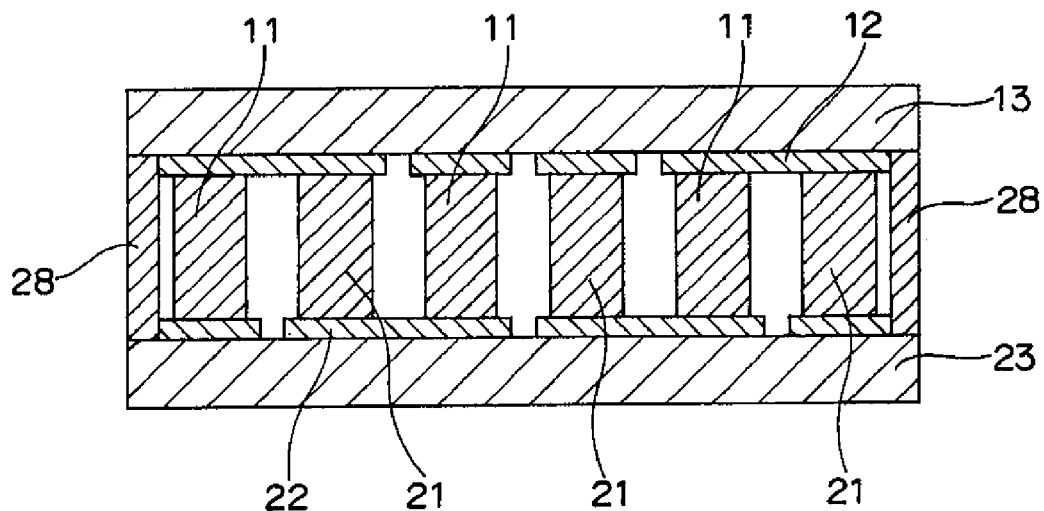
FIG. 6B is a section view (1) taken along lines D-D' in FIG. 6A.

The sealing member 28 of the peripheral border may be formed so as to be separate from the thermoelectric elements as shown in FIG. 6B, or may be formed so as to be in contact with the thermoelectric elements.

Figure 6C:
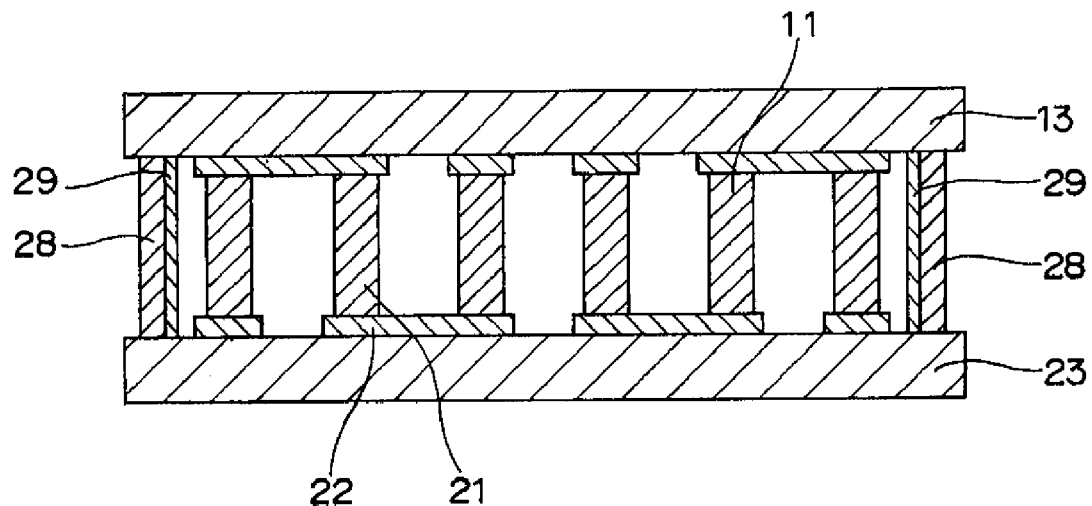
FIG. 6C is a section view (2) taken along lines D-D' in FIG. 6A.

Moreover, in the present invention, as shown in FIG. 6C, it is preferable that a protection layer 29 for protecting the sealing member inside the sealing member 28 is formed.

Thereby, by suppressing the contact between the sealing member and the elements, accuracy degradation due to ebb of heat from the elements can be suppressed. Moreover, because strength of the sealing member is improved by the protection layer, damage of the sealing part due to the difference of barometric pressures can be suppressed.

Figure 7A:
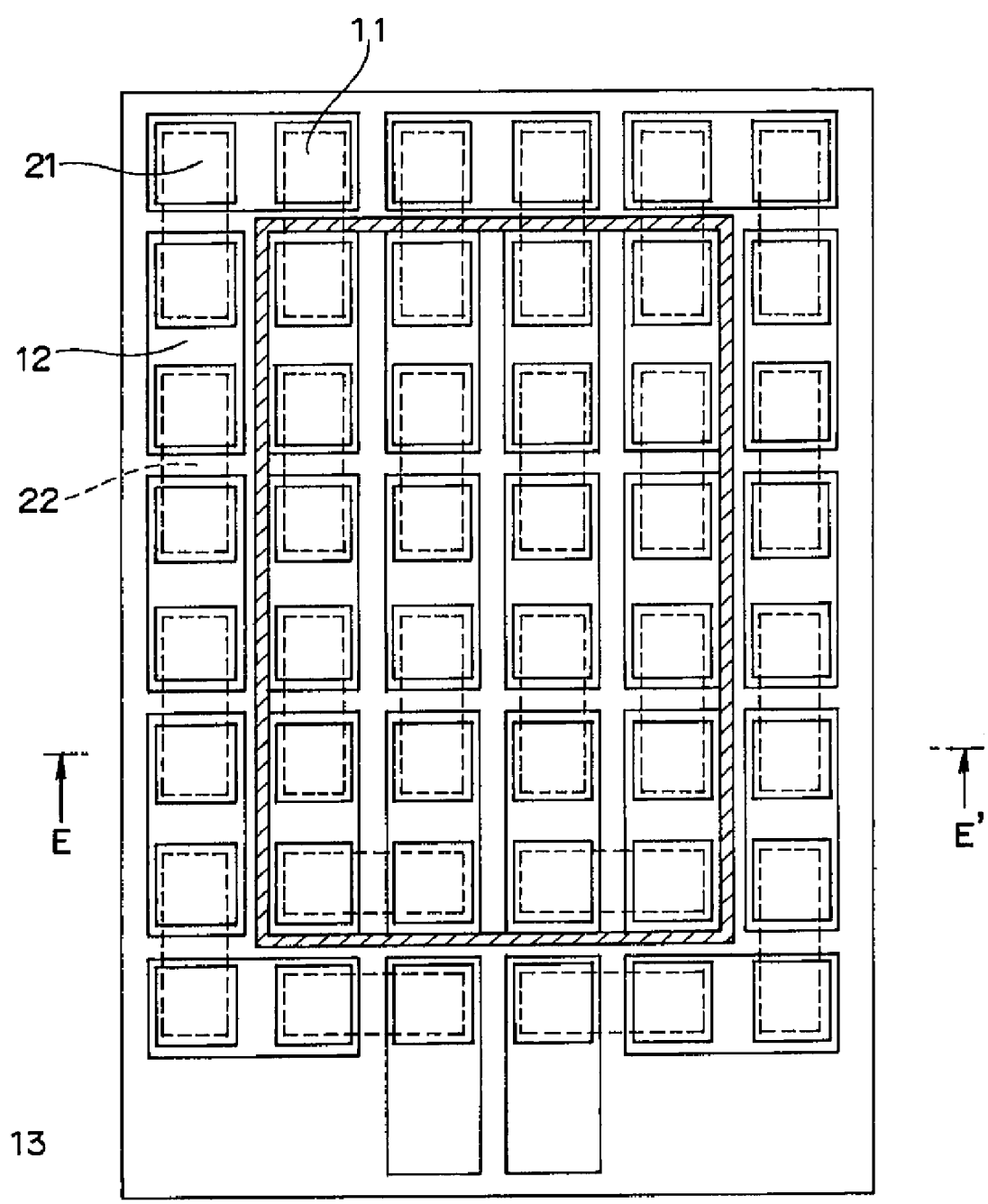
FIG. 7A is a perspective view of a thermoelectric module of a first modified example according to the embodiment 2 that is viewed from the above of a first support substrate.

Moreover, in the present invention, some of the plurality of P-type thermoelectric elements and the plurality of N-type thermoelectric elements may be disposed in the sealed space composed by the sealing member 28. In FIG. 7A, as an example thereof, the sealing member 28 is provided so that the thermoelectric elements in the inner side except the thermoelectric elements provided in the outermost sides are disposed in the sealed space.

This way is effective for limiting a place of which temperature is to be detected, to a central part of the elements. In particular, when the temperature-detecting element is contained therein, such an element as a thermistor is selectively suppressed, and ebb of heat to the sealing member can be suppressed to be a minimum limit.

Figure 7B:
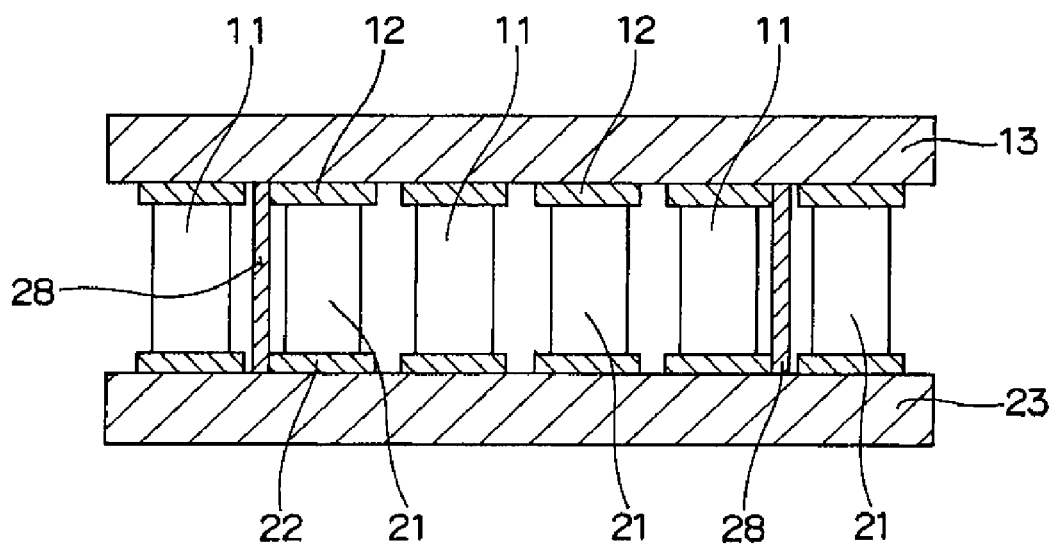
FIG. 7B is a section view (1) taken along lines E-E' in FIG. 7A.

In addition, in an example as shown in FIG. 7A, as shown in FIG. 7B (a section view taken along lines E-E' in FIG. 7A), the sealing member 28 is provided so as not to be in contact with the thermoelectric elements. However, the present invention is not limited thereto, and the sealing member 28 may be in contact with the thermoelectric elements.

In this case, the sealing member 28 may be formed so as to be in contact with the thermoelectric elements existing inside, and may be formed so as to be in contact with the thermoelectric elements existing outside. Furthermore, the sealing member 28 may be formed on both the thermoelectric elements existing inside and the thermoelectric elements existing outside.

Figure 7C:
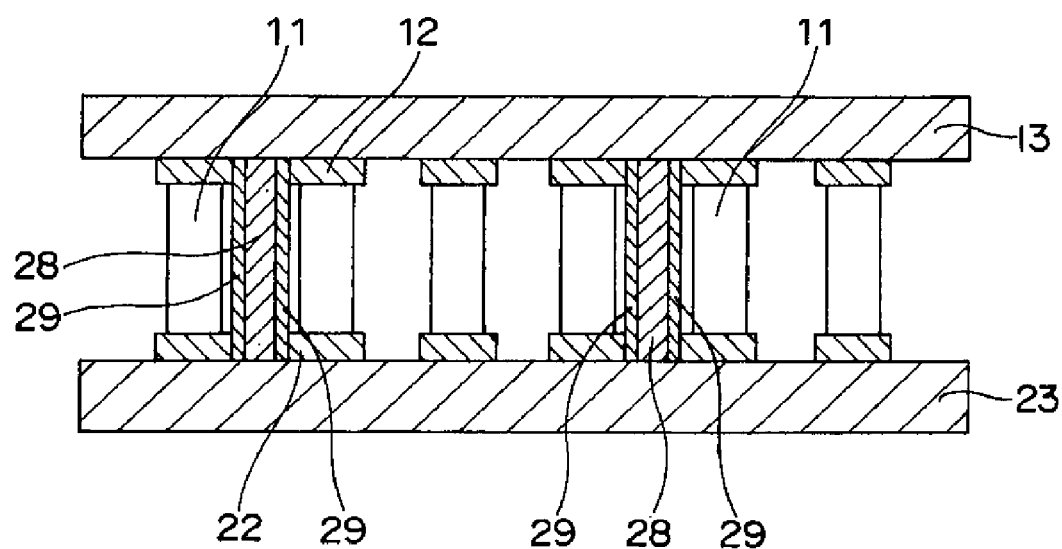
FIG. 7C is a section view (2) taken along lines E-E' in FIG. 7A.

Moreover, in the present invention, as shown in FIG. 7C, a protection layer 29 may be formed inside and/or outside the sealing member 28 may be formed.

Furthermore, in the thermoelectric module of the present invention, the sealing member 28 may be formed so as to be filled between the P-type thermoelectric elements contiguous to each other, between the N-type thermoelectric elements contiguous to each other, or between the P-type and N-type thermoelectric elements contiguous to each other.

Figure 8A:
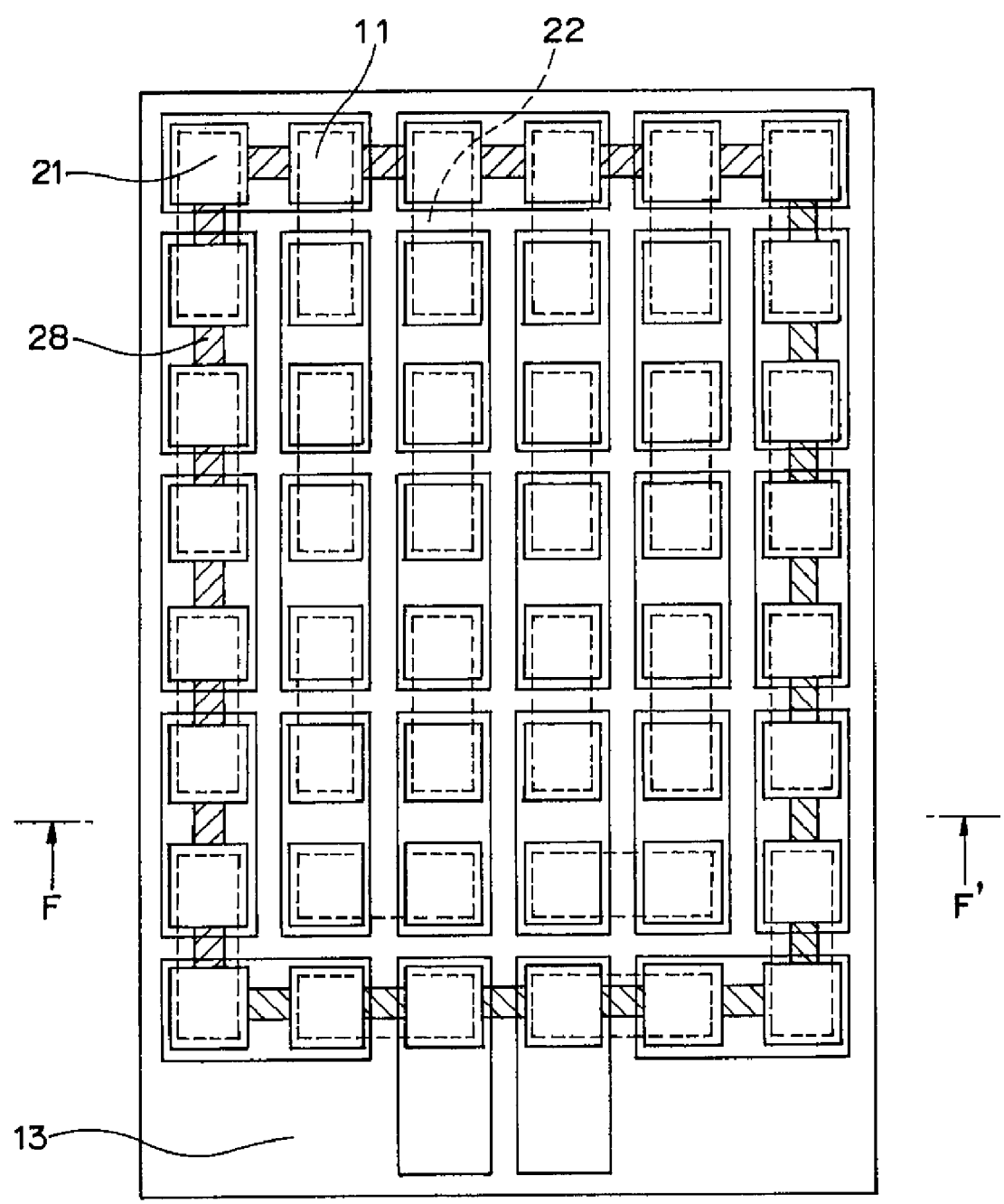
FIG. 8A is a perspective view of a thermoelectric module of a second modified example according to the embodiment 2 that is viewed from the above of a first support substrate.
Figure 8B:
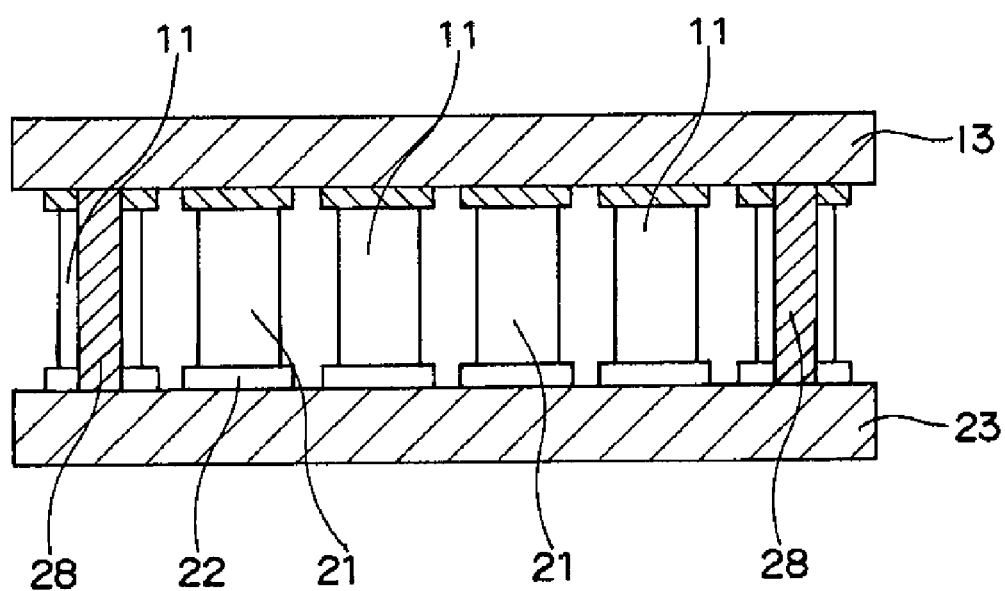
FIG. 8B is a section view taken along lines F-F' in FIG. 8A.

As one example thereof, in FIG. 8A and FIG. 8B that is a section view of FIG. 8A, the thermoelectric module in which the sealing member 28 is formed so as to be filled between the P-type and N-type thermoelectric elements that are located in an outermost side and that are contiguous to each other.

Figure 9A:
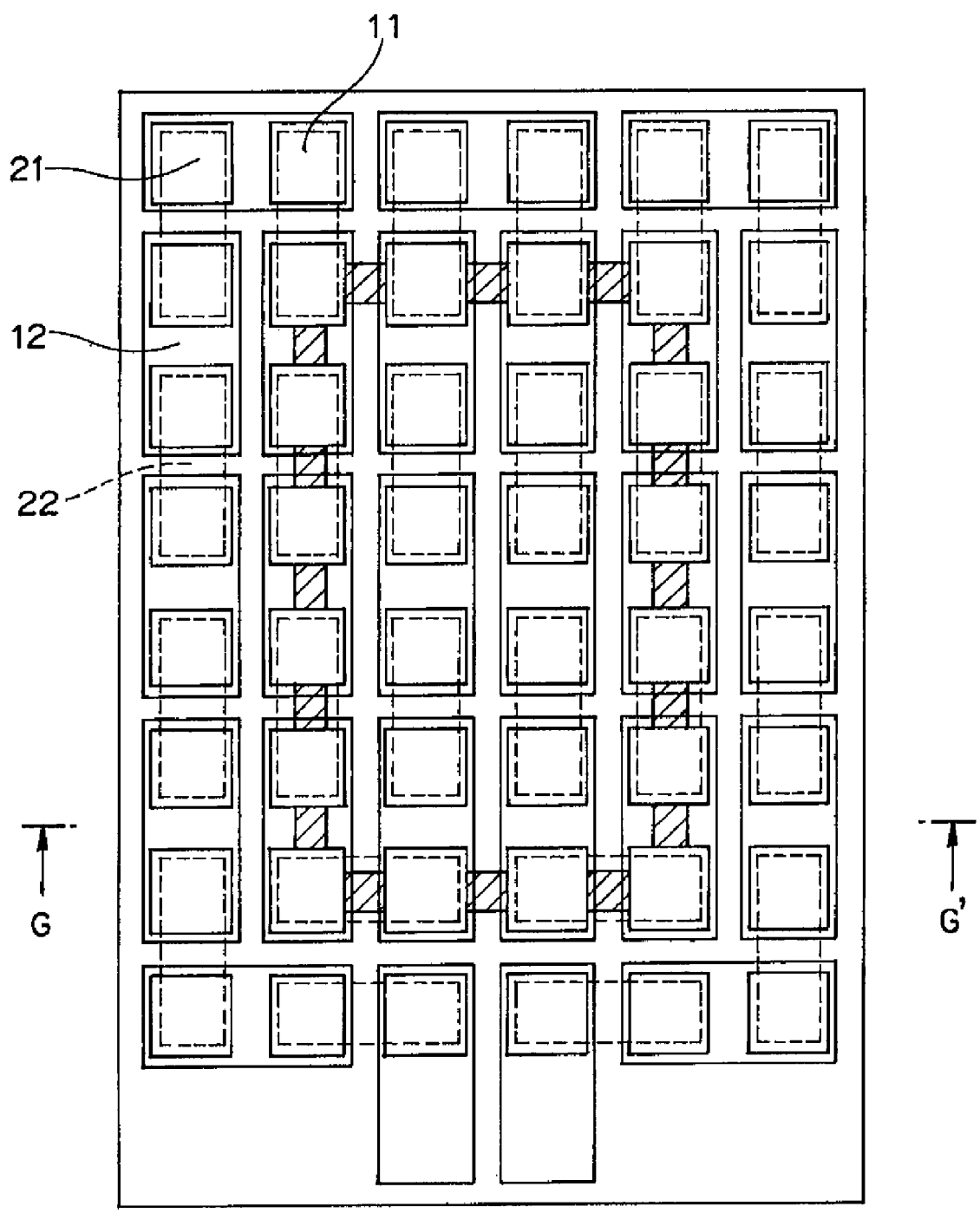
FIG. 9A is a perspective view of a thermoelectric module of a third modified example according to the embodiment 2 that is viewed from the above of a first support substrate.
Figure 9B:
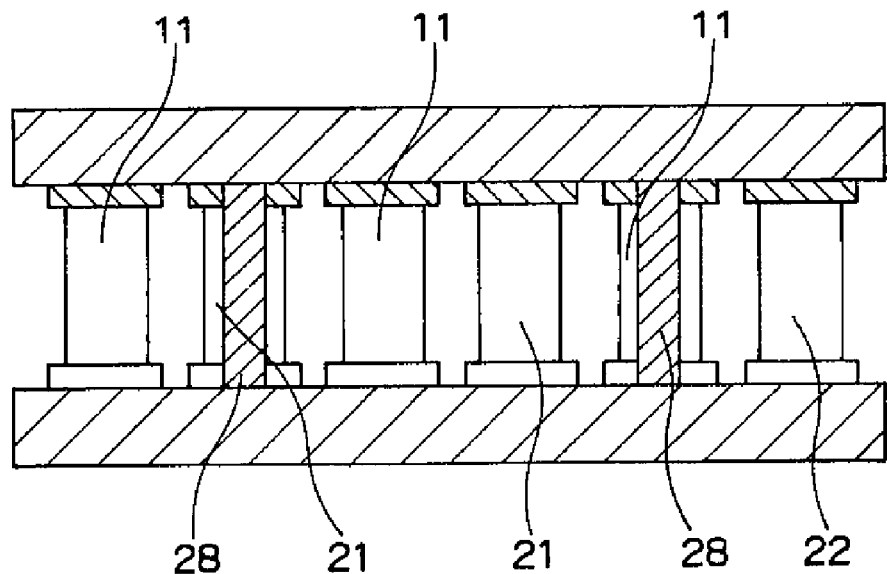
FIG. 9B is a section view taken along lines G-G' in FIG. 8A.
Figure 10:
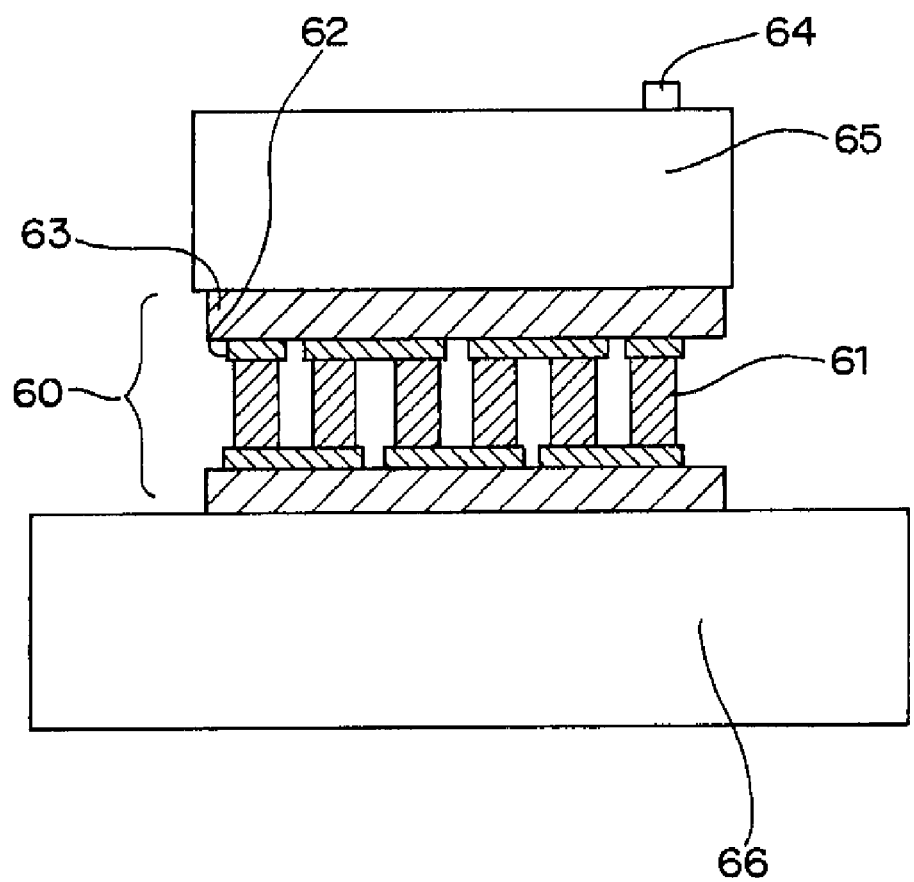
FIG. 10 is a section view of a conventional thermoelectric module.

Moreover, in FIG. 9A and FIG. 9B that is a section view of FIG. 9A, as another example, the thermoelectric module in which the sealing member 28 is formed so as to be filled between the inside thermoelectric elements (between the P-type and N-type thermoelectric elements). In addition, in the thermoelectric module as shown in FIG. 9A, the sealing member 28 is formed so as to be filled between the P-type and N-type thermoelectric elements that are located at a second position from the outer side and contiguous to each other. However, the sealing member 28 may be further formed between the thermoelectric elements existing inside.

Moreover, in the thermoelectric elements as shown in FIG. 8A or FIG. 9A, as the sealing member 28, two or more of sealing materials having different hardnesses may be used.

Furthermore, in the thermoelectric module as shown in FIG. 8A or FIG. 9A, as the sealing member 28, sealing materials having different hardnesses corresponding to the sides of the support substrate may be used.

Moreover, in the thermoelectric module in which the first and second support substrates have an approximately rectangular shape, it is preferable that the sealing materials provided so as to correspond to long sides of the first and second support substrates have lower hardnesses than those of sealing materials which are provided so as to correspond to short sides thereof.

Furthermore, also in the thermoelectric module shown in FIG. 8A or FIG. 9A, it is preferable that a dry gas is sealed in the sealed space or that the inside of the sealed space is depressurized.

EXAMPLES

The present invention will be explained with reference to Examples. However, the present invention is not limited to the following Examples.

Hereinafter, the support substrates No. 1-10 used in Examples will be explained.

(No. 1-10 of Support Substrates)

The support substrates No. 1 were a conventional example, and on main surfaces of the support substrates in the high-temperature side and in the low-temperature side, only the electrodes of the thermoelectric module were provided.

In the support substrates No. 2, on the main surface (inner surface) of the first support substrate 13 to be in the high-temperature side, there were provided the first connecting electrodes 12 of the thermoelectric module, a thermistor-disposed part (see, FIG. 2A and so forth) contiguous to one of the electrodes, and a wiring pattern connected to the thermistor-disposed part. On the main surface (inner surface) of the second support substrate 23 in the low-temperature side, the second connecting electrodes 22 of the thermoelectric module were provided.

In the support substrates No. 3, on the main surface (inner surface) of the second support substrate 23 to be in the high-temperature side, the second connecting electrodes 22 of the thermoelectric module were provided. On the main surface (inner surface) of the first support substrate 13 to be in the low-temperature side, there were provided the first connecting electrodes 12 of the thermoelectric module, a thermistor-disposed part (see, FIG. 2A) contiguous to one of the first connecting electrodes 12, and a wiring pattern connected to the thermistor-disposed part.

In the support substrates No. 4, on the main surface of the second support substrate to be in the high-temperature side, the electrodes of the thermoelectric module were provided. On the main surface of the first support substrate to be in the low-temperature side, the electrodes of the thermoelectric module were provided, and on the back surface of the support substrate, a thermistor-disposed part and a wiring pattern connected to the thermistor-disposed part were provided.

In the support substrates No. 5, on the main surface (inner surface) of the first support substrate 13 to be in the high-temperature side, there were provided the first connecting electrodes 12 of the thermoelectric module, a thermistor-disposed part (see, FIG. 2A) contiguous to one of the first connecting electrodes 12, and a wiring pattern connected to the thermistor-disposed part. Also, on the main surface (inner surface) of the second support substrate to be in the low-temperature side, there were provided the second connecting electrodes 22 of the thermoelectric module, a thermistor-disposed part contiguous to one of the second connecting electrodes 22, and a wiring pattern connected to the thermistor-disposed part.

In the support substrates No. 6, on the main surface of the second support substrate 23 to be in the high-temperature side, the second connecting electrodes of the thermoelectric module were provided. On the main surface of the first support substrate 13 to be in the low-temperature side, the first connecting electrodes of the thermoelectric module and a thermistor-disposed part contiguous to one of the first connecting electrodes were provided.

In the support substrates No. 7, on the main surface of the second support substrate 23 to be in the high-temperature side, the second connecting electrodes 22 of the thermoelectric module were provided. On the main surface of the first support substrate 13 to be in the low-temperature side, the first connecting electrodes of the thermoelectric module and a thermistor-disposed part contiguous to one of the first connecting electrodes were provided.

In the support substrates No. 8, on the main surface of the second support substrate 23 to be in the high-temperature side, the second connecting electrodes 22 of the thermoelectric module were provided. On the main surface of the first support substrate 13 to be in the low-temperature side, there were provided the first connecting electrodes 12 of the thermoelectric module, a thermistor-disposed part contiguous to two of the first connecting electrodes, and a wiring pattern connected to the thermistor-disposed part.

In the support substrates No. 9, on the main surface of the second support substrate 23 to be in the high-temperature side, the second connecting electrodes of the thermoelectric module were provided. On the main surface of the first support substrate to be in the low-temperature side, there were provided the first connecting electrodes of the thermoelectric module, a thermistor-disposed part (see, FIG. 3A) contiguous to three of the first connecting electrodes, and a wiring pattern connected to the thermistor-disposed part.

In the support substrates No. 10, on the main surface of the second support substrate to be in the high-temperature side, the second connecting electrodes of the thermoelectric module were provided. On the main surface of the first support substrate to be in the low-temperature side, there were provided the first connecting electrodes of the thermoelectric module, a thermistor-disposed part contiguous to four of the first connecting electrodes (see, FIG. 4A), and a wiring pattern connected to the thermistor-disposed part.

(Production of Thermoelectric Modules No. 1-10)

By using the support substrates No. 1-10 as described above, the thermoelectric modules No. 1-10 were produced.

First, an N-type thermoelectric material made of Bi, Te, and Se, and a P-type thermoelectric material made of Di, Sb, and Te, which became solidified after once melted, were solidified in one direction by Bridgman method. And, the N-type thermoelectric material and the P-type thermoelectric material that were rod shapes each having a square-shaped cross-section of 1.6 mm on a side were prepared. On each of the side surfaces of them, a resist for preventing a material to be plated from adhering thereto was coated, and then they were sliced by a wire saw by a width of 1.4 mm, and thereby N-type thermoelectric elements and P-type thermoelectric elements were obtained. Only on the sliced surfaces of the obtained N-type thermoelectric elements and the obtained P-type thermoelectric elements, nickel layers were formed by electrolytic plating, and thereon Au layers were disposed, and the resists were delaminated with a dissolving solution, and thereby the N-type thermoelectric elements and the P-type thermoelectric elements were obtained.

A solder paste of 95Sn-5Sb was applied by using a metal mask to the electrodes on the support substrate in the high-temperature side and on the support substrate in the low-temperature side and to the thermistor-disposed parts. Over the solder paste, the respective thermoelectric elements were arrayed and set by using a parts feeder so that the N-type thermoelectric element and the P-type thermoelectric element were electrically connected in series. Moreover, on the thermistor-disposed part, a thermistor is disposed by using a parts feeder.

The N-type thermoelectric elements and the P-type thermoelectric elements that were arrayed as described above were heat-treated in a reflow furnace so as to be sandwiched by two support substrates along with applying pressure to the upper and lower surfaces. The module in which the thermoelectric elements and the support substrates were bonded was immersed in a cleaning solution and thereby flux that adhered to the thermoelectric elements and to the support substrates and that had been contained in the solder paste was cleaned. Then, the entire faces of the peripheral border of the thermoelectric elements were sealed with silicone resin. A lead wire for flowing electric current in the thermoelectric module and a lead wire for performing electrical connection with the thermistor were attached thereto, and thereby the thermoelectric modules No. 1-10 were produced. In addition, in the thermoelectric modules No. 1-10, the temperature-detecting element having a rectangular solid shape was used.

By using the above-described modules, Tests 1 and 2 were performed according to the following procedures.

(Test 1)

First, a heat exchanger was disposed in an evaluation case, and the thermoelectric module that a heat conductive grease was applied to both surfaces of was prepared. The heat exchanger was attached to the support substrate in the high-temperature side of the thermoelectric module by using a heat conductive grease. Moreover, on the support substrate in the low-temperature side, a metal block made of aluminum that had the same size as the thermoelectric module and that had a thickness of 5 mm was disposed as the object to be treated by using a heat conductive grease. In the heat exchanger, a channel through which water can flow is provided inside, and by flowing 25° C. water through the channel, the temperature of the support substrate in the high-temperature side of the thermoelectric module was held to be constant. The inside of the evaluation case was set to be an environment not to be subjected to dew condensation by closing the evaluation case and by flowing a nitrogen gas therethrough, and an electric current of $I_{max}$ in the thermoelectric module was flowed, and thereby the object to be treated was cooled. In addition, in the conventional example No. 1, the thermistor was fixed onto the object to be treated with an adhesive agent and the temperature of the thermistor was measured. In the No. 2-10, the temperature of the support substrate was measured by the temperature-detecting element such as the thermistor or a thermocouple, which was attached to the support substrate.

A safety circuit was set so that the electric current in the thermoelectric module was blocked when the temperature measured by such a temperature-detecting element became at 300° C. higher than the temperature cooled by flowing the $I_{max}$. Then, there was performed the test for insulating the electric current in the thermoelectric module with the security circuit when the water in the heat exchanger to which the thermoelectric module was attached was blocked. Then, an initial resistance of the thermoelectric module was measured, and the above-described test was repeated at ten times and then the resistance of the thermoelectric module was measured and the percentage change of resistance before and after the tests was obtained. The upper limit of acceptance of the percentage change of resistance was set to be 0.5% or less, and thereby effectiveness of the thermoelectric module of the present invention was confirmed. Five samples were used for each of No. 1-10 and each of the results was evaluated by the average of the samples. The results are shown in "Percentage Change of Resistance in Test 1" of Table 1.

(Test 2)

As Test 2, in the same manner as Test 1, the modules No. 1-10 were used, and a heat exchanger was disposed in an evaluation case, and the thermoelectric module that a heat conductive grease was applied to both surfaces of was prepared, and the heat exchanger was attached to the support substrate in the high-temperature side of the thermoelectric module by using a heat conductive grease, and on the support substrate in the low-temperature side, a metal block made of aluminum that had the same size as the thermoelectric module and that had a thickness of 5 mm was disposed as the object to be treated by using a heat conductive grease. The thermistor was fixed onto the object to be treated with an adhesive agent and thereby it was made possible to measure the temperature of the object to be treated. In the heat exchanger, a channel through which water can flow is provided inside, and by flowing 25° C. water through the channel, the temperature of the support substrate in the high-temperature side of the thermoelectric module was held to be constant. The inside of the evaluation case was set to be an environment not to be subjected to dew condensation by closing the evaluation case and by flowing a nitrogen gas therethrough, and the thermoelectric module was controlled by the temperature of the thermistor provided on the side of the object to be treated so that the temperature of the object to be treated became −30° C., and there were performed 10000 cycles of current-supplying tests in which the −30° C. was kept for approximately 1 min and then the electric current was being turned off for 1 min. The present invention provided with the temperature-detecting element on the side of the support substrate was controlled so that the temperature of the object to be treated was detected and therewith the temperature of the temperature-detecting element disposed on the substrate side was also feedbacked to the power source and thereby overshooting of the temperature of the object to be treated became smaller as much as possible. An initial resistance of the thermoelectric module was preliminarily measured, and after performing the 10000 cycles of the above-described tests, the resistance of the thermoelectric module was measured and the percentage change of resistance before and after the tests was obtained. The upper limit of acceptance of the percentage change of resistance was set to be 0.6% or less, and thereby effectiveness of the thermoelectric module of the present invention was confirmed. Five samples were used for each of No. 1-10 and each of the results was evaluated by the average of the samples. The results are shown in "Percentage Change of Resistance in Test 2" of Table 1.

Moreover, the temperature detection accuracy of the temperature-detecting element provided on each of the substrates was compared so that the overshooting amount of the set value of −30° C. in each of the above-described evaluations serves as variability of the measurement. The results are shown in "Variability of Measured Temperature in Test 2" of Table 1.

TABLE 1

| No. | Substrate Low-Temperature Side | Substrate High-Temperature Side | Temperature-Detecting Element Form | Temperature-Detecting Element Wiring | Position of Temperature-Detecting Element Low-Temperature Side | Position of Temperature-Detecting Element High-Temperature Side |
|---|---|---|---|---|---|---|
| 1 | Existence | Existence | Thermistor | Existence | None | None |
| 2 | Existence | Existence | Thermistor | Existence | None | Main Surface |
| 3 | Existence | Existence | Thermistor | Existence | Main Surface | None |
| 4 | Existence | Existence | Thermistor | Existence | Back Surface | None |
| 5 | Existence | Existence | Thermistor | Existence | Main Surface | Main Surface |
| 6 | Existence | Existence | Thermistor | None | Main Surface | None |
| 7 | Existence | Existence | Thermocouple | — | Main Surface | None |
| 8 | Existence | Existence | Thermistor | Existence | Main Surface | None |
| 9 | Existence | Existence | Thermistor | Existence | Main Surface | None |
| 10 | Existence | Existence | Thermistor | Existence | Main Surface | None |

| No. | Position(s) between Temperature-Detecting Element and Thermoelectric Element(s) | Percentage Change of Resistance in Test 1 | Percentage Change of Resistance in Test 2 | Variability of Measured Temperature in Test 2 |
|---|---|---|---|---|
| 1 | One Face | 20% | 10% | 8° C. |
| 2 | One Face | 0.1% | 0.6% | 2.2° C. |
| 3 | One Face | 0.3% | 0.4% | 1° C. |
| 4 | One Face | 0.8% | 0.9% | 2.5° C. |
| 5 | One Face | 0.1% | 0.4% | 0.9° C. |
| 6 | One Face | 0.4% | 0.5% | 1.5° C. |
| 7 | One Face | 0.5% | 0.6% | 2° C. |
| 8 | Two Faces | 0.2% | 0.3% | 0.7° C. |
| 9 | Three Faces | 0.2% | 0.2% | 0.5° C. |
| 10 | Four Faces | 0.1% | 0.2% | 0.4° C. |

(Test Results in Tests 1 and 2)

In Table 1 the percentage change of resistance (Test 1) of the conventional example No. 1 in which the temperature-detecting element was provided on the object to be treated was 20%, which was large. On the other hand, the percentage change of resistance (Test 1) of each of the samples No. 2, 3, 5-10 of the present invention provided with the temperature-detecting element on an inner surface of the support substrate thereof was 0.5% or less, which was favorable. This is assumed to be because the temperature-detecting speed of the temperature-detecting element according to the present invention is high.

Moreover, in a similar way in Table 1, the percentage change of resistance (Test 2) of the No. 1 was 10%, which was large. On the other hand, that (Test 2) of each of the samples No. 2, 3, 5-10 of the present invention provided with the temperature-detecting element on an inner surface of the support substrate thereof was 0.6% or less, which was favorable. This is assumed to be because by feedbacking the temperature from the temperature-detecting element disposed on the support substrate to the control of the thermoelectric module, the overshoot over the set temperature became smaller and thereby the load on the thermoelectric module becomes smaller.

When the No. 4 in which the thermistor was disposed on the back surface of the support substrate and the No. 3 in which the thermistor was disposed on the main surface are compared, the No. 3 is smaller in percentage change of resistance of Test 1 and Test 2. This is assumed to be because in the thermoelectric module No. 4 in which the thermistor was disposed on the back surface, a little broken piece from the thermistor by contact with the object to be treated in the assembly was contained and, the results in the five samples scattered and thereby, the average of the percentage changes of resistance became degraded. On the other hand, all of the modules each having the thermistor attached to the main surface were functioning normally because the thermistor was not damaged at all. Accordingly, the percentage changes of most of the five samples were approximately 0.2%, indicating favorable results.

When the No. 2 in which the thermistor was disposed on the main surface of the support substrate in the high-temperature side and the No. 3 in which the thermistor was disposed on the main surface of the support substrate in the low-temperature side are compared, the No. 3 of the disposition in the low-temperature side indicates the smaller percentage change of resistance in Test 2. In this case, it is thought that when the object to be treated was sharply cooled, the temperature in front of the object to be treated was measured and feedbacked to the power source for the thermoelectric module and therefore, the load on the thermoelectric module became small and therefore, the percentage change of resistance became smaller. However, in Test 1, the No. 2 in which the thermistor was disposed in the high-temperature side indicates a very small percentage change of resistance. This is thought to be because the thermistor was near the heat exchanger and therefore, the temperature-detecting speed was the quickest.

In the result of the No. 5 in which the thermistors were provided on both of the support substrates, both of the percentage changes of resistance in Test 1 and 2 were small.

The No. 3 having the thermistor-disposed part contiguous to the thermoelectric elements in one face, the No. 8 having the thermistor-disposed part contiguous to the thermoelectric elements in two faces, the No. 9 having the thermistor-disposed part contiguous to the thermoelectric elements in three faces, and the No. 10 having the thermistor-disposed part contiguous to the thermoelectric elements in four faces, are compared. Therefore, as the number of the faces contiguous to the thermoelectric elements was increased, the percentage change of resistance in Test 2 became smaller. This corresponds to the result of the variability of measured temperature. Therefore, as the faces surrounded by the thermoelectric elements are larger, the thermistor becomes more difficult to be affected by the temperature in the peripheral border, and therefore, the temperature-detecting accuracy becomes improved. In addition, as described above, "A temperature-detecting element is contiguous to thermoelectric elements in one face" means that they are opposed to one side face out of four side faces in a rectangular solid, and "A temperature-detecting element is contiguous to thermoelectronic elements in two faces" means that they are opposed to two side faces out of four side faces in a rectangular solid, and "A temperature-detecting element is contiguous to thermoelectronic elements in three faces" means that means that they are opposed to three faces out of four side faces in a rectangular solid, and "A temperature-detecting element is contiguous to thermoelectronic elements in four faces" means that means that they are opposed to all the four side faces out of four side faces in a rectangular solid.

When the No. 6 in which a thermistor is used as the temperature-detecting element and the No. 7 in which a thermocouple is used as the temperature-detecting element are compared, the No. 6 in which a thermistor is used indicates more favorable results in both Tests 1 and 2. This is thought to be because in the case of a thermocouple, ebb of heat is large and therefore, the thermocouple is easily subjected to affection of the temperature of the peripheral border and by contrast, the thermistor is a small size and has a small heat capacity and therefore is excellent in stability of temperature.

When the No. 3 in which the wiring pattern of the thermistor is provided and the No. 6 in which the wiring pattern is not provided are compared, more favorable results have been obtained in the No. 3 in Tests 1 and 2. Also as its reason, it is thought to be because ebb of heat in the lead wire becomes smaller by separating the positions of the thermistor and the lead wire for performing electrical connection with the thermistor.

As described above, by using the thermoelectric module according to the present invention, durability and temperature measurement accuracy of the thermoelectric module can be improved.

(Production of Thermoelectric Modules No. 11-17)

Samples for No. 11-13 were produced by using the above-described support substrates (see, FIG. 2) used in the No. 3, and samples for No. 14-17 were produced by using the support substrates (see, FIG. 4) used in the No. 10. The method for producing them until the step of cleaning the module produced by bonding was the same as the production method of the Example explained in (Production of Thermoelectric Modules No. 1-10), and the method for coating the thermistor and for sealing the outer circumference were different as follows according to the individual samples.

In the No. 11, the sealing member in the peripheral border of the elements did not exist, and also, the insulation coating was not performed on the thermistor and the wiring pattern of the thermistor.

In the No. 12, the sealing in the peripheral border of the elements did not exist, and an epoxy-based UV-cured adhesive agent was applied onto the thermistor and the wiring pattern of the thermistor by using a dispenser, and was cured by an ultraviolet ray, and the insulation coating was performed.

In the No. 13, the sealing member in the peripheral border of the elements was produced by, applying a silicone resin onto the entire faces of the peripheral border of the elements in an atmospheric air having a humidity of 40-60% by using a dispenser, and then curing the resin at a room temperature. And, an epoxy-based UV-cured adhesive agent was applied onto the thermistor and the wiring pattern of the thermistor by using a dispenser, and was cured by an ultraviolet ray, and the insulation coating was performed.

In the No. 14, the sealing in the peripheral border of the elements was produced by, applying a silicone resin onto the entire faces of the peripheral border of the elements in an atmospheric air having a humidity of 40-60% by using a dispenser, and then curing the resin at a room temperature.

In the No. 15, the sealing in the peripheral border of the elements was produced by, applying a silicone resin by using a dispenser and curing the resin at a room temperature, then injecting a small tube through the silicone resin, flowing a 0-40° C. dry air inside the sealing by using the tube, and then performing sealing with a silicone adhesive agent again.

In the No. 16, the sealing in the peripheral border of the elements was produced by, applying a silicone resin by using a dispenser and curing the resin at a room temperature, then injecting a small tube through the silicone resin, vacuuming therefrom by using the tube, applying a silicone adhesive agent having a high viscosity to the periphery of the small tube, then slowly pulling out the tube so that the silicone resin in the peripheral part was made to enter the hole opened by the tube, and thereby performing sealing.

In the No. 17, the sealing in the peripheral border of the elements was produced by, applying a heat-cured epoxy adhesive agent onto two faces opposed to each other and thermally curing the agent at a temperature of 120° C., and applying a silicone resin onto the other two faces in an atmospheric air having a humidity of 40-60% by using a dispenser, and then curing the resin at a room temperature.

Such thermoelectric modules of No. 11-17 as described above were produced by attaching a lead wire for flowing electric current in each of the thermoelectric modules and a lead wire for performing electrical connection with the thermistor.

By using the above-described modules, Test 3 was performed according to the following procedure.

(Test 3)

A heat exchanger was disposed in an evaluation case, and the thermoelectric module that a heat conductive grease was applied to both surfaces of was prepared. The heat exchanger was attached to the support substrate in the high-temperature side of the thermoelectric module by using a heat conductive grease. On the support substrate in the low-temperature side, a metal block made of aluminum that had the same size as the thermoelectric module and that had a thickness of 5 mm was disposed as the object to be treated by using a heat conductive grease. The thermistor was fixed onto the object to be treated with an adhesive agent and thereby it was made possible to measure the temperature of the object to be treated. In the heat exchanger, a channel through which water can flow is provided inside, and by flowing 25° C. water through the channel, the temperature of the support substrate in the high-temperature side of the thermoelectric module was held to be constant. The inside of the evaluation case was purposely set to be an environment to be subjected to dew condensation in an atmospheric air having a humidity of 30-60% by closing the evaluation case, and the thermoelectric module was controlled by the temperature of the thermistor provided on the side of the object to be treated so that the temperature of the object to be treated became −30° C., and there were performed 10000 cycles of current-supplying tests in which the −30° C. was kept for approximately 1 min and then the electric current was being turned off for 1 min. The present invention provided with the temperature-detecting element on the side of the support substrate was controlled so that the temperature of the object to be treated was detected and therewith the temperature of the temperature-detecting element disposed on the substrate side was also feedbacked to the power source and thereby overshooting of the temperature of the object to be treated became smaller as much as possible. An initial resistance of the thermoelectric module was preliminarily measured, and after performing the 10000 cycles of the above-described tests, the resistance of the thermoelectric module was measured and the percentage change of resistance before and after the tests was obtained. Five samples were used for each of No. 11-17 and each of the results was evaluated by the average of the samples. The results are shown in "Percentage Change of Resistance in Test 3" of Table 2.

Moreover, the temperature detection accuracy of the temperature-detecting element provided on each of the substrates was compared so that the overshooting amount of the set value of −30° C. in each of the above-described evaluations serves as variability of the measurement. The results are shown in "Variability of Measured Temperature in Test 3" of Table 2.

Furthermore, the power consumption was calculated from the multiplication of values of power voltage and electric current in the thermoelectric module in the test, and when the power consumption became smaller, the cooling performance of the thermoelectric module was determined to be improved.

The above-described results are shown in Table 2.

TABLE 2

| No. | Position(s) between Temperature-Detecting Element and Thermoelectric Element(s) | Thermistor Coating | Sealing of Peripheral Border | Sealing Material Material (1) | Sealing Material Material (2) |
|---|---|---|---|---|---|
| 11 | One Face | None | None | — | — |
| 12 | One Face | Existence | None | — | — |
| 13 | One Face | Existence | Existence | Silicone | — |
| 14 | Four Faces | None | Existence | Silicone | — |
| 15 | Four Faces | None | Existence | Silicone | — |
| 16 | Four Faces | None | Existence | Silicone | — |
| 17 | Four Faces | None | Existence | Silicone | Epoxy |

| No. | Atmosphere inside Sealing | Percentage Change of Resistance in Test 3 | Variability of Measured Temperature in Test 3 | Average of Power Consumption in Test 3 |
|---|---|---|---|---|
| 11 | Air | Ground Leakage | 10° C. | — |
| 12 | Air | Ground Leakage | 1° C. | — |
| 13 | Air | 0.4% | 1° C. | 82 W |
| 14 | Air | 0.2% | 0.4° C. | 80 W |
| 15 | Dry Air | 0.2% | 0.3° C. | 80 W |
| 16 | Vacuum | 0.2% | 0.3° C. | 72 W |
| 17 | Air | 0.1% | 0.4° C. | 80 W |

In Table 2, when the No. 11 in which insulation coating was not performed on both the thermistor and the wiring pattern of the thermistor and the No. 12 in which insulation coating was performed on both the thermistor and the wiring pattern of the thermistor are compared, the variability of measured temperature in the No. 12 is much more reduced. It is assumed that in the No. 11, by performing the test in the environment to be subjected to dew condensation, the thermistor and the wiring pattern became subjected to dew condensation and the accurate temperature could not be feedbacked to the power source side of the thermoelectric module, and therefore the variability of measured temperature is large, and by contrast, in the No. 12, because the thermistor and the wiring pattern thereof are insulation-coated, the accurate temperature could be feedbacked to the power source side of the thermoelectric module and therefore lead to reduce the variability of measured temperature.

In the No. 11 and 12, because the peripheral border of the thermoelectric elements was not sealed, ground leakage became caused from the electrodes of the thermoelectric module in the environment to be subjected to dew condensation, and the test was interrupted on the way. On the other hand, in the No. 13 in which the peripheral border of the thermoelectric elements was sealed, the 10000 cycles could be achieved without ground leakage and the percentage change of resistance of 1% or less could be achieved.

Next, when the No. 13 (see, FIG. 2) in which the peripheral border of the thermoelectric elements was sealed and the thermistor was disposed outside the border and the No. 14 (see, FIG. 4) in which the peripheral border of the thermoelectric elements was sealed and the thermistor was disposed inside the border are compared, the No. 14 is reduced more than No. 13 in all of, percentage change of resistance, variability of measured temperature, and average of power consumption, after the 10000 cycles. This is assumed to be because the thermistor was disposed in the space surrounded by the thermoelectric elements and thereby, became difficult to be affected by the temperature of the peripheral border and therefore, the variability of measured temperature became smaller and, it became possible to accurately feedback the temperature to the power source for the thermoelectric module and therefore to lead to reduce the load on the thermoelectric module and, the percentage change of resistance and the power consumption became reduced.

When the No. 14 in which the atmosphere inside the sealing of the peripheral border of the thermoelectric elements had a humidity of 40-60% and the No. 15 in which the atmosphere inside the sealing was a 0-40° C. dry air are compared, No. 15 is more reduced than No. 16 in variability of measured temperature. This is assumed to be because dew condensation is more difficult to be caused in the case in which a dry air is introduced into the inside of the sealing.

Moreover, when No. 14 and No. 15, and No. 16 in which the inside of the sealing was vacuumized, are compared, the cooling performance was more improved and the power consumption was more reduced, in the No. 16.

Last, when the No. 14 in which the sealing of the peripheral border of the elements was the silicone adhesive agent in all of the four faces and the No. 17 in which the sealing of the peripheral border of the elements was set to be the epoxy adhesive agent in two faces opposed to each other and the silicone adhesive agent in the other two faces opposed to each other, the percentage change of resistance in the No. 17 was more reduced than that of No. 14. This is thought to be that by setting two faces opposed to each other to be epoxy having a high hardness, the outer circumference of the support substrates subjected to the largest thermal stress was held and, by setting the other two faces opposed to each other to be a silicone adhesive agent, it became possible to let the thermal stress get away by deformation and therefore, the percentage change of resistance became smaller.

As described above, by using the thermoelectric module of the present invention, the temperature measurement can be performed without affected by dew condensation even in an atmospheric air, and durability and measured-temperature accuracy in the thermoelectric module can be improved.

(Investigation of Thermistor Position)

The thermoelectric module in which wave-shaped fins made of copper were bonded to both sides thereof as the heat exchanger by using Sn58-Bi42 solder was produced. Electric current was supplied in the thermoelectric module in the state that an air was being flowed from a side surface so that the air could pass though the wave-shaped fins, and thereby the air flowing through the wave-shaped fins connected to the support substrate in the cooling side becomes a cold wind. For controlling the temperature of such a cold wind, the support substrate is provided with the temperature-detecting element (s). However, here, the temperature-detecting elements were provided at three places of, the inlet side, the center, and the outlet side, and then the temperatures were measured. Also, with respect to the temperature of the cold wind coming out of the wave-shaped fin, temperatures were measured at three points, and thereby the average temperature thereof was measured at the same time.

By comparing difference between the temperatures of each of the thermistors provided on the support substrate and the cold wind, it was investigated which position was the most appropriate for the position of the thermistor in order to control the cold wind.

The result is shown in Table 3.

TABLE 3

| Position of Thermistor | Difference between Temperatures of Cold Wind and Thermistor |
| --- | --- |
| Inlet Side | 5.4° C. |
| Center | 2.8° C. |
| Outlet Side | 0.2° C. |

From Table 3, by providing the thermistor disposed on the support surfaces in the outlet side, the temperature to be measured becomes very near to the temperature of the cold wind, and therefore the temperature of the cold wind can be controlled.

What is claimed is:

1. A thermoelectric module comprising:
a first support substrate having a first inner surface, a first outer surface and a plurality of first connecting electrodes formed on the first inner surface;
a second support substrate having a second inner surface opposed to the first inner surface, a second outer surface and a plurality of second connecting electrodes formed on the second inner surface;
a plurality of P-type thermoelectric elements and a plurality of N-type thermoelectric elements, which are provided alternately between the first inner surface and the second inner surface;
a temperature-detecting element provided on the first inner surface;
a sealing member formed in a periphery of the first support substrate and the second support substrate to form a sealed space for sealing the plurality of P-type thermoelectric elements and the plurality of N-type thermoelectric elements between the first inner surface and the second inner surface, the sealing member comprising a first sealing material and a second sealing material which has a hardness higher than the first sealing material,
wherein each of the first connecting electrodes and the second connecting electrodes connects one of the P-type thermoelectric elements with neighboring one of the N-type thermoelectric elements to form a series connection,
wherein the first and second support substrates have a square shape, the sealing materials formed so as to correspond to its two sides opposed to each other are equivalent and the sealing materials formed so as to correspond to its two sides contiguous to each other have different hardnesses.

2. The thermoelectric module according to claim 1 further comprising:
a heat exchanger provided on the first outer surface or on the second outer surface, the heat exchanger having a channel through which a fluid flows;
wherein the temperature-detecting element is provided on an outlet side from which the fluid outflows.

3. The thermoelectric module according to claim 1, wherein the first support substrate is a substrate of which temperature becomes low when electric current is applied thereto.

4. The thermoelectric module according to claim 1, wherein the first support substrate is a substrate of which temperature becomes high when electric current is applied thereto.

5. The thermoelectric module according to claim 1, wherein the plurality of P-type thermoelectric elements and the plurality of N-type thermoelectric elements are regularly arrayed lengthwise and crosswise.

6. The thermoelectric module according to claim 1, wherein the temperature-detecting element is provided between adjacent two of the first connecting electrodes.

7. The thermoelectric module according to claim 1, wherein the temperature-detecting element is provided at a position surrounded by four of the first connecting electrodes.

8. The thermoelectric module according to claim 1, further comprising a wiring pattern connected to the temperature-detecting element on the first inner surface.

9. The thermoelectric module according to claim 8, wherein the temperature-detecting element and the wiring pattern are coated with a coating material having an insulating property and a wet resistance.

10. The thermoelectric module according to claim 1, wherein a dry gas is sealed in the sealed space.

11. The thermoelectric module according to claim 1, wherein the sealed space is depressurized.

12. The thermoelectric module according to claim 1, wherein the temperature-detecting element is provided in the sealed space.

13. The thermoelectric module according to claim 1, wherein the first sealing material includes a material containing a silicone-based material as a main component, and the second sealing material includes a material containing an epoxy-based material as a main component.

14. A thermoelectric module comprising:
a first support substrate having a first inner surface, a first outer surface and a plurality of first connecting electrodes formed on the first inner surface;
a second support substrate having a second inner surface opposed to the first inner surface, a second outer surface and a plurality of second connecting electrodes formed on the second inner surface;
a plurality of P-type thermoelectric elements and a plurality of N-type thermoelectric elements, which are provided alternately between the first inner surface and the second inner surface;
a heat exchanger provided on the first outer surface;
a temperature-detecting element provided on the first inner surface, the temperature-detecting element being provided on an outlet side from which the fluid outflows;
a sealing member formed in a periphery of the first support substrate and the second support substrate to form a sealed space for sealing the plurality of P-type thermoelectric elements and the plurality of N-type thermoelectric elements between the first inner surface and the second inner surface,
wherein each of the first connecting electrodes and the second connecting electrodes connects one of the P-type thermoelectric elements with neighboring one of the N-type thermoelectric elements to form a series connection,
wherein the sealing member is made of two or more of sealing materials having different hardnesses,
wherein the first and second support substrates have a square shape, the sealing materials formed so as to correspond to its two sides opposed to each other are equivalent and the sealing materials formed so as to correspond to its two sides contiguous to each other have different hardnesses.

15. The thermoelectric module according to claim 14, wherein the first support substrate is a substrate of which temperature becomes low when electric current is applied thereto.

16. The thermoelectric module according to claim 14, wherein the first support substrate is a substrate of which temperature becomes high when electric current is applied thereto.

17. The thermoelectric module according to claim 14, wherein the plurality of P-type thermoelectric elements and the plurality of N-type thermoelectric elements are regularly arrayed lengthwise and crosswise.

18. The thermoelectric module according to claim 14, wherein the temperature-detecting element is provided between adjacent two of the first connecting electrodes.

19. The thermoelectric module according to claim 14, wherein the temperature-detecting element is provided at a position surrounded by four of the first connecting electrodes.

20. The thermoelectric module according to claim 14, further comprising a wiring pattern connected to the temperature-detecting element on the first inner surface.

21. The thermoelectric module according to claim 20, wherein the temperature-detecting element and the wiring pattern are coated with a coating material having an insulating property and a wet resistance.

22. A thermoelectric module comprising:
a first support substrate having a first inner surface, a first outer surface and a plurality of first connecting electrodes formed on the first inner surface;
a second support substrate having a second inner surface opposed to the first inner surface, a second outer surface and a plurality of second connecting electrodes formed on the second inner surface;
a plurality of P-type thermoelectric elements and a plurality of N-type thermoelectric elements, which are provided alternately between the first inner surface and the second inner surface;
a heat exchanger provided on the first outer surface;
a temperature-detecting element provided on the first inner surface, the temperature-detecting element being provided on an outlet side from which the fluid outflows;
a sealing member formed in a periphery of the first support substrate and the second support substrate to form a sealed space for sealing the plurality of P-type thermoelectric elements and the plurality of N-type thermoelectric elements between the first inner surface and the second inner surface,
wherein each of the first connecting electrodes and the second connecting electrodes connects one of the P-type thermoelectric elements with neighboring one of the N-type thermoelectric elements to form a series connection,
wherein the sealing member is made of two or more of sealing materials having different hardnesses,
wherein the first and second support substrates have a rectangular shape, the sealing materials formed so as to correspond to long sides of the first and second support substrates have lower hardnesses than those of sealing materials formed so as to correspond to short sides thereof.

23. The thermoelectric module according to claim 14, wherein a dry gas is sealed in the sealed space.

24. The thermoelectric module according to claim 14, wherein the sealed space is depressurized.

25. The thermoelectric module according to claim 14, wherein the temperature-detecting element is provided in the sealed space.

* * * * *